US012288637B2

(12) United States Patent
Sugi et al.

(10) Patent No.: US 12,288,637 B2
(45) Date of Patent: Apr. 29, 2025

(54) MULTILAYER RESIN SUBSTRATE AND METHOD OF MANUFACTURING MULTILAYER RESIN SUBSTRATE

(71) Applicant: Murata Manufacturing Co., Ltd., Nagaokakyo (JP)

(72) Inventors: Rintaro Sugi, Nagaokakyo (JP); Keisuke Araki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 711 days.

(21) Appl. No.: 17/569,557

(22) Filed: Jan. 6, 2022

(65) Prior Publication Data

US 2022/0130593 A1    Apr. 28, 2022

Related U.S. Application Data

(63) Continuation of application No. PCT/JP2020/027688, filed on Jul. 16, 2020.

(30) Foreign Application Priority Data

Jul. 19, 2019  (JP) ................................ 2019-133245

(51) Int. Cl.
*H01F 27/28*    (2006.01)
*H01F 27/29*    (2006.01)
(Continued)

(52) U.S. Cl.
CPC ......... *H01F 27/2804* (2013.01); *H01F 27/29* (2013.01); *H01F 27/323* (2013.01);
(Continued)

(58) Field of Classification Search
CPC .... H01F 27/2804; H01F 27/29; H01F 27/323; H01F 41/042; H01F 41/122;
(Continued)

(56) References Cited

U.S. PATENT DOCUMENTS

| 2016/0027578 A1 | 1/2016 | Nishino et al. |
| 2016/0049237 A1 | 2/2016 | Yosui |
| 2019/0341180 A1 | 11/2019 | Ito |

FOREIGN PATENT DOCUMENTS

| JP | 2-110907 A | 4/1990 |
| JP | 7-263231 A | 10/1995 |

(Continued)

OTHER PUBLICATIONS

Official Communication issued in International Patent Application No. PCT/JP2020/027688, mailed on Sep. 24, 2020.

*Primary Examiner* — Tuyen T Nguyen
(74) *Attorney, Agent, or Firm* — Keating & Bennett, LLP

(57) ABSTRACT

A multilayer resin substrate includes a stacked body, and a coil including a first coil conductor pattern and a second coil conductor pattern. The second coil conductor pattern includes a wide portion with a line width larger than a line width of the first coil conductor pattern. The wide portion includes overlapping portions that overlap with the first coil conductor pattern, and non-overlapping portions that do not overlap with the first coil conductor pattern, when viewed in a Z-axis direction. Adjacent non-overlapping portions in the Z-axis direction, when viewed in the Z-axis direction, protrude in opposite directions to each other in a radial direction, with respect to the first coil conductor pattern.

12 Claims, 17 Drawing Sheets

(51) Int. Cl.
*H01F 27/32* (2006.01)
*H01F 41/04* (2006.01)
*H01F 41/12* (2006.01)

(52) U.S. Cl.
CPC ......... *H01F 41/042* (2013.01); *H01F 41/122* (2013.01); *H01F 2027/2809* (2013.01); *H01F 27/2871* (2013.01)

(58) Field of Classification Search
CPC ......... H01F 27/2871; H01F 2027/2809; H01F 41/041; H01F 5/003; H05K 1/16; H05K 3/46
USPC ................................................ 336/200, 232
See application file for complete search history.

(56) References Cited

FOREIGN PATENT DOCUMENTS

| | | | | | |
|---|---|---|---|---|---|
| JP | 2008-118059 | A | | 5/2008 | |
| JP | 2011-82371 | A | | 4/2011 | |
| JP | 2015-50422 | A | | 3/2015 | |
| WO | 2015/005161 | A1 | | 1/2015 | |
| WO | WO-2015079941 | A1 | * | 6/2015 | ......... H01F 17/0013 |
| WO | WO-2018174133 | A1 | * | 9/2018 | ......... H01F 27/2804 |

* cited by examiner

MULTILAYER RESIN SUBSTRATE AND METHOD OF MANUFACTURING MULTILAYER RESIN SUBSTRATE

CROSS REFERENCE TO RELATED APPLICATIONS

This application claims the benefit of priority to Japanese Patent Application No. 2019-133245 filed on Jul. 19, 2019 and is a Continuation Application of PCT Application No. PCT/JP2020/027688 filed on Jul. 16, 2020. The entire contents of each application are hereby incorporated herein by reference.

BACKGROUND OF THE INVENTION

1. Field of the Invention

The present invention relates to a multilayer resin substrate in which a plurality of resin layers each include a coil conductor pattern, and relates to a method of manufacturing such a multilayer resin substrate.

2. Description of the Related Art

Conventionally, a multilayer resin substrate including a stacked body provided by stacking a plurality of resin layers, and a coil configured to include a plurality of coil conductor patterns provided in the stacked body and including a winding axis in a stacking direction, has been known.

For example, International Publication No. 2018/174133 discloses a multilayer resin substrate including a coil conductor pattern including a wide portion of which a line width is larger than a line width of other coil conductor patterns. The wide portion of the multilayer resin substrate includes a non-overlapping portion that does not overlap with the other coil conductor patterns when viewed in the stacking direction, and the non-overlapping portion is curved so as to be close to the other coil conductor patterns. According to this configuration, a flow of resin near the other coil conductor patterns at a time of thermocompression bonding (when the stacked body is formed) may be significantly reduced or prevented by curved non-overlapping portion, so that displacement, deformation, or the like of the other coil conductor patterns with the flow of resin at the time of thermocompression bonding is significantly reduced or prevented. Therefore, a change in electrical characteristics due to the displacement or the like of the other coil conductor patterns is able to be significantly reduced or prevented.

For the purpose of obtaining desired characteristics, an inductance value, or the like, a large number of coil conductor patterns may be overlapped with each other in a stacking direction to form a multi-turn coil in a stacked body. However, in a case in which a plurality of coil conductor patterns each including a wide portion are provided and non-overlapping portions of two adjacent wide portions in the stacking direction are overlapped with each other, unwanted capacitance is formed between the non-overlapping portions, and electrical characteristics of the coil may change.

SUMMARY OF THE INVENTION

Preferred embodiments of the present invention, in a configuration including a coil provided with a plurality of non-overlapping portions, provide multilayer resin substrates that each significantly reduce or prevent a change in electrical characteristics of the coil by significantly reducing or preventing unwanted capacitance that may be generated between adjacent non-overlapping portions in a stacking direction, and methods of manufacturing such multilayer resin substrates.

A multilayer resin substrate according to a preferred embodiment of the present invention includes a stacked body including a plurality of resin layers stacked on each other, and a coil including a plurality of coil conductor patterns, respectively, on three or more resin layers among the plurality of resin layers, and including a winding axis in a stacking direction of the plurality of resin layers, and the plurality of coil conductor patterns include a first coil conductor pattern, and a plurality of second coil conductor patterns disposed adjacent to the first coil conductor pattern in the stacking direction and including a wide portion with a line width larger than a line width of the first coil conductor pattern, the wide portion includes an overlapping portion that overlaps with an adjacent first coil conductor pattern, when viewed in the stacking direction, and a non-overlapping portion that does not overlap with the adjacent first coil conductor pattern, when viewed in the stacking direction, and the first coil conductor pattern is disposed on one side or each side in the stacking direction of at least one second coil conductor pattern among the plurality of second coil conductor patterns, and the non-overlapping portion of the at least one second coil conductor pattern is curved so as to be closer in the stacking direction to the first coil conductor pattern disposed on one side in the stacking direction of the at least one second coil conductor pattern than the overlapping portion of the at least one second coil conductor pattern, and the non-overlapping portions of two adjacent second coil conductor patterns in the stacking direction, among the plurality of second coil conductor patterns, when viewed in the stacking direction, protrude in opposite directions to each other in a radial direction of the second coil conductor patterns, with respect to the first coil conductor pattern.

According to such a configuration, the non-overlapping portions of the two adjacent second coil conductor patterns in the stacking direction, significantly protrude in opposite directions in the radial direction of the second coil conductor patterns, so that the non-overlapping portions of the two adjacent second coil conductor patterns in the stacking direction include little overlap. Therefore, unwanted capacitance that may be generated between the non-overlapping portions of the two adjacent second coil conductor patterns in the stacking direction is able to be significantly reduced or prevented.

In general, a coil conductor pattern with a small line width is more prone to displacement, deformation, or the like with a flow of resin at a time of thermocompression bonding than a coil conductor pattern with a large line width. In contrast, in the above configuration, the non-overlapping portion of at least one second coil conductor pattern is curved so as to be closer to the first coil conductor pattern than the overlapping portion. As a result, the flow of resin near the first coil conductor pattern that easily flows at the time of thermocompression bonding is significantly reduced or prevented by a curved non-overlapping portion. Therefore, displacement or the like of the first coil conductor pattern with the flow of resin at the time of thermocompression bonding is significantly reduced or prevented.

A method of manufacturing a multilayer resin substrate according to a preferred embodiment of the present invention includes a coil conductor forming step of forming a plurality of coil conductor patterns including a first coil conductor pattern, and a plurality of second coil conductor patterns including a wide portion with a line width larger than a line width of the first coil conductor pattern, respectively, on three or more resin layers among a plurality of resin layers, a stacking step of stacking, after the coil conductor forming step, the plurality of resin layers such that the wide portion of the plurality of second coil conductor patterns is divided into an overlapping portion that overlaps with the first coil conductor pattern and a non-overlapping portion that does not overlap with the first coil conductor pattern, when viewed in a stacking direction of the plurality of resin layers, and the non-overlapping portions of two adjacent second coil conductor patterns in the stacking direction, when viewed in the stacking direction, protrude in opposite directions to each other in a radial direction of the second coil conductor patterns, with respect to the first coil conductor pattern, and the first coil conductor pattern is disposed on one side or each side in the stacking direction of at least one second coil conductor pattern among the plurality of second coil conductor patterns, and a stacked body forming step of forming, after the stacking step, a stacked body by thermally compressing a stack of a plurality of resin layers and causing the non-overlapping portion of the at least one second coil conductor pattern to be curved so as to be closer in the stacking direction to the first coil conductor pattern disposed on one side in the stacking direction of the at least one second coil conductor pattern than the overlapping portion of the at least one second coil conductor pattern.

According to the manufacturing method described above, even with a configuration including a coil in which a plurality of non-overlapping portions are provided, a multilayer resin substrate capable of significantly reducing or preventing a change in electrical characteristics of the coil due to capacitance to be generated between the non-overlapping portions is able to be easily obtained.

According to preferred embodiments of the present invention, in a configuration including a coil in which a plurality of non-overlapping portions are provided, multilayer resin substrates that each significantly reduce or prevent a change in electrical characteristics of the coil by significantly reducing or preventing unwanted capacitance that may be generated between adjacent non-overlapping portions in a stacking direction are able to be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
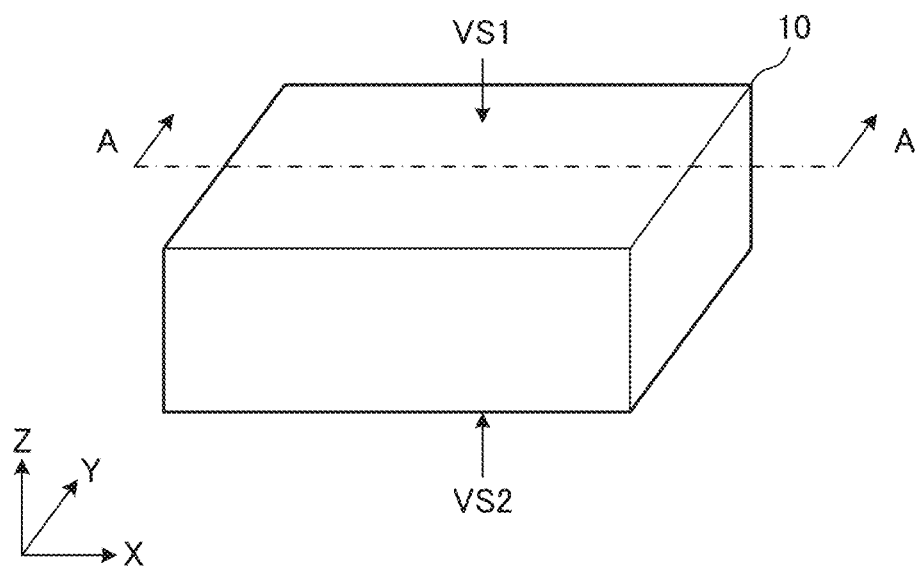
FIG. 1 is an external perspective view of a multilayer resin substrate 101 according to a first preferred embodiment of the present invention.

Hereinafter, preferred embodiments of the present invention will be described with reference to the attached drawings and several specific examples. In the drawings, components and elements assigned with the same reference numerals or symbols represent the same or corresponding components and elements. While preferred embodiments of the present invention are divided and described for the sake of convenience in consideration of ease of description or understanding of main points, elements described in different preferred embodiments are able to be partially replaced and combined with each other. In second and subsequent preferred embodiments, a description of matters common to the first preferred embodiment will be omitted and only different points will be described. In particular, the same or substantially the same advantageous functions and effects by the same or substantially the same configurations will not be described one by one for each preferred embodiment.

First Preferred Embodiment

Figure 2:
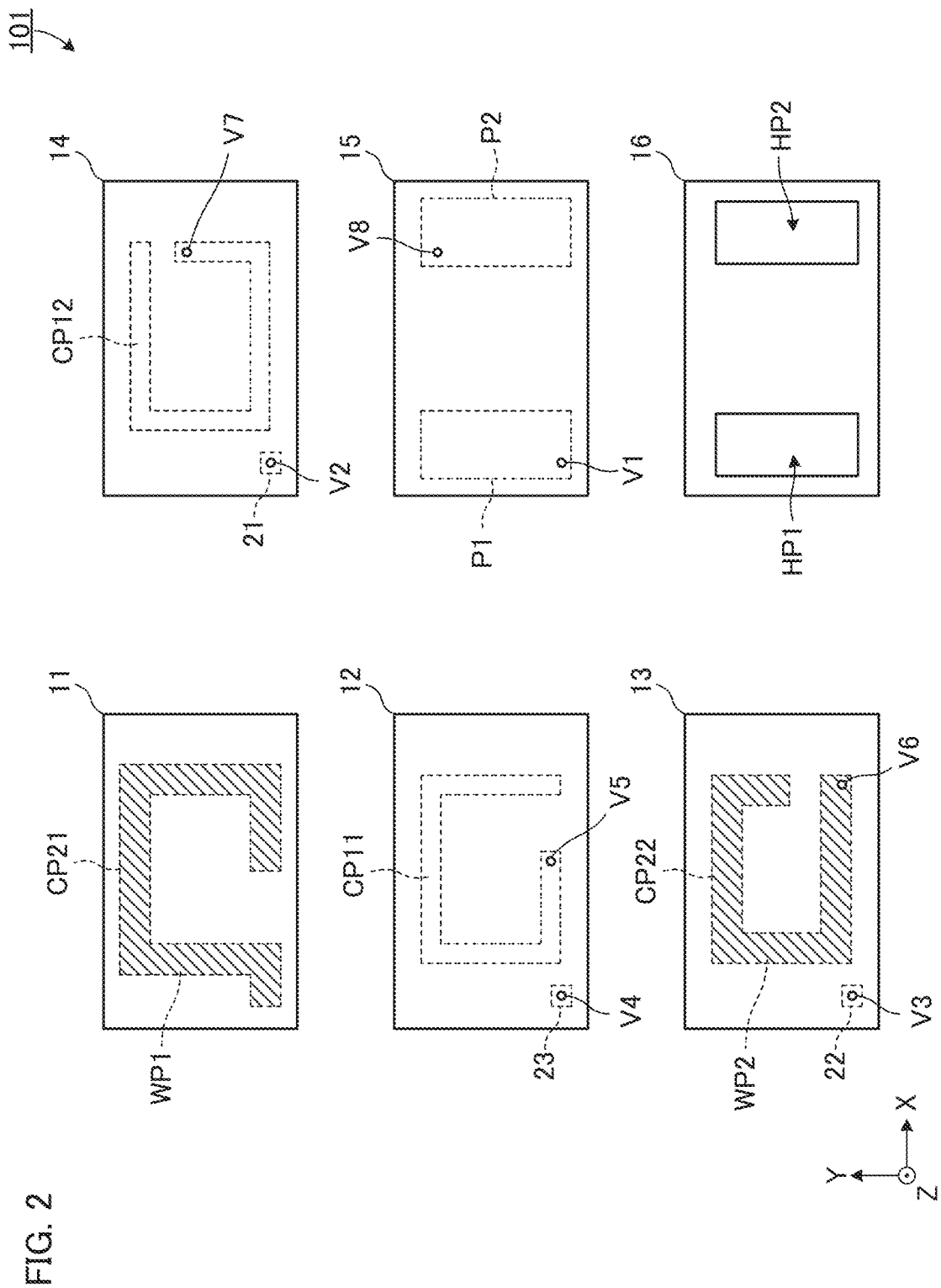
FIG. 2 is an exploded plan view of the multilayer resin substrate 101.
Figure 3:
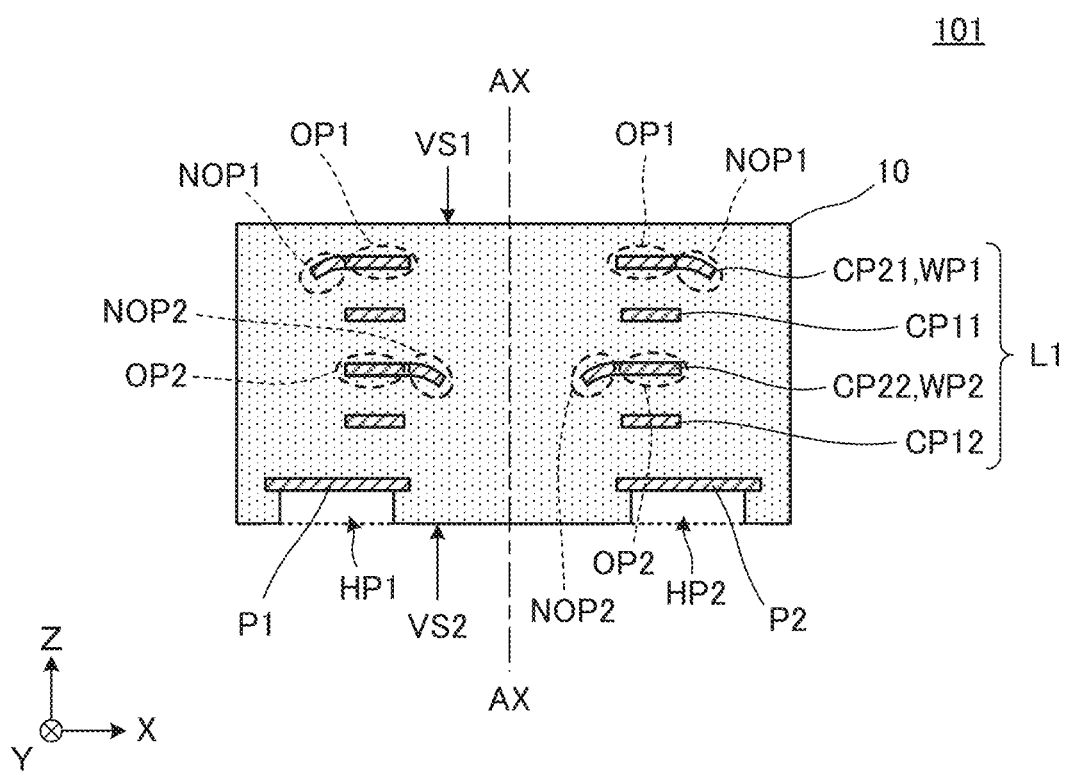
FIG. 3 is an A-A cross-sectional view in FIG. 1.

FIG. 1 is an external perspective view of a multilayer resin substrate 101 according to a first preferred embodiment of the present invention. FIG. 2 is an exploded plan view of the multilayer resin substrate 101. FIG. 3 is an A-A cross-sectional view in FIG. 1. It is to be noted that, in FIG. 2, in order to make the structure easy to understand, wide portions WP1 and WP2 of second coil conductor patterns CP21 and CP22 are indicated by hatching.

The multilayer resin substrate 101 includes a stacked body 10, a coil L1, and external electrodes P1 and P2. As will be described below, the coil L1 includes a plurality of coil conductor patterns (one or more first coil conductor patterns CP11 and CP12, and two or more second coil conductor patterns CP21 and CP22), and includes a winding axis AX in a Z-axis direction.

The stacked body 10 has a rectangular or substantially rectangular parallelepiped shape with a longitudinal direction that coincides with an X-axis direction and includes a first main surface VS1 and a second main surface VS2 that face each other. The coil L1 is provided inside the stacked body 10, and the external electrodes P1 and P2 are exposed (provided near the second main surface VS2) to the second main surface VS2 of the stacked body 10.

The stacked body 10 is provided by sequentially stacking and thermally compressing resin layers 16, 15, 14, 13, 12, and 11. The first main surface VS1 and the second main surface VS2 of the stacked body 10 are surfaces perpendicular or substantially perpendicular to a stacking direction (a Z-axis direction) of the plurality of resin layers 11, 12, 13, 14, 15, and 16. Each of the resin layers 11 to 16 is a flat plate made of a thermoplastic resin and having a rectangular or substantially rectangular shape of which the longitudinal direction coincides with the X-axis direction, and each have flexibility. The resin layers 11 to 16 are sheets made of a liquid crystal polymer (LCP) or a polyether ether ketone (PEEK), for example, as a main material.

A second coil conductor pattern CP21 is provided on a back surface of the resin layer 11. The second coil conductor pattern CP21 is a rectangular or substantially rectangular loop-shaped conductor pattern of about one turn wound along an outer periphery of the resin layer 11. The second coil conductor pattern CP21 is preferably a conductor pattern such as Cu foil, for example.

A first coil conductor pattern CP11 and a conductor pattern 23 are provided on a back surface of the resin layer 12. The first coil conductor pattern CP11 is a rectangular or substantially rectangular loop-shaped conductor pattern of about one turn wound along an outer periphery of the resin layer 12. The conductor pattern 23 is a rectangular or substantially rectangular conductor pattern disposed in a vicinity of a first corner (a lower left corner of the resin layer 12 in FIG. 2) of the resin layer 12. The first coil conductor pattern CP11 and the conductor pattern 23 are preferably conductor patterns such as Cu foil, for example. In addition, interlayer connection conductors V4 and V5 are provided in the resin layer 12.

A second coil conductor pattern CP22 and a conductor pattern 22 are provided on a back surface of the resin layer 13. The second coil conductor pattern CP22 is a rectangular or substantially rectangular loop-shaped conductor pattern of about one turn wound along an outer periphery of the resin layer 13. The conductor pattern 22 is a rectangular or substantially rectangular conductor pattern disposed in the vicinity of a first corner (a lower left corner of the resin layer 13 in FIG. 2) of the resin layer 13. The second coil conductor pattern CP22 and the conductor pattern 22 are preferably conductor patterns such as Cu foil, for example. In addition, interlayer connection conductors V3 and V6 are provided in the resin layer 13.

A first coil conductor pattern CP12 and a conductor pattern 21 are provided on a back surface of the resin layer 14. The first coil conductor pattern CP12 is a rectangular or substantially rectangular loop-shaped conductor pattern of about one turn wound along an outer periphery of the resin layer 14. The conductor pattern 21 is a rectangular or substantially rectangular conductor pattern disposed in the vicinity of a first corner (a lower left corner of the resin layer 14 in FIG. 2) of the resin layer 14. The first coil conductor pattern CP12 and the conductor pattern 21 are preferably conductor patterns such as Cu foil, for example. In addition, interlayer connection conductors V2 and V7 are provided in the resin layer 14.

External electrodes P1 and P2 are provided on a back surface of the resin layer 15. The external electrodes P1 and P2 are rectangular or substantially rectangular conductor patterns of which the longitudinal direction coincides with a Y-axis direction. The external electrode P1 is disposed in the vicinity of a first side (a left side of the resin layer 15 in FIG. 2) of the resin layer 15, and the external electrode P2 is disposed in the vicinity of a second side (a right side of the resin layer 15 in FIG. 2) of the resin layer 15. The external electrodes P1 and P2 may be conductor patterns such as Cu foil, for example. In addition, interlayer connection conductors V1 and V8 are provided in the resin layer 15.

Opening portions HP1 and HP2 are provided in the resin layer 16. The opening portion HP1 is a rectangular or substantially rectangular through hole disposed in the vicinity of a first side (a left side of the resin layer 16 in FIG. 2) of the resin layer 16, and the opening portion HP2 is a rectangular or substantially rectangular through hole disposed in the vicinity of a second side (a right side of the resin layer 16 in FIG. 2) of the resin layer 16. The opening portion HP1 is provided at a position corresponding to a position of the external electrode P1, and the opening portion HP2 is provided at a position corresponding to a position of the external electrode P2. Therefore, even in a case in which the resin layer 16 is stacked on the back surface of the resin layer 15, the external electrode P1 is exposed from the opening portion HP1 to outside, and the external electrode P2 is exposed from the opening portion HP2 to the outside.

As shown in FIG. 2, one end of the second coil conductor pattern CP21 is connected to one end of the first coil conductor pattern CP11 through the interlayer connection conductor V5, and the other end of the first coil conductor pattern CP11 is connected to one end of the second coil conductor pattern CP22 through the interlayer connection conductor V6. In addition, the other end of the second coil conductor pattern CP22 is connected to one end of the first coil conductor pattern CP12 through the interlayer connection conductor V7. As described above, a plurality of coil conductor patterns (one or more first coil conductor patterns CP11 and CP12, and two or more second coil conductor patterns CP21 and CP22) provided on the three or more resin layers 11 to 14 and the interlayer connection conductors V5, V6, and V7 define the coil L1 with a winding axis AX in the Z-axis direction.

In addition, a first end of the coil L1 is connected to the external electrode P1, and a second end of the coil L1 is connected to the external electrode P2. Specifically, the other end of the second coil conductor pattern CP21 is connected to the external electrode P1 through the conductor patterns 21, 22, and 23 and the interlayer connection conductors V1, V2, V3, and V4. In addition, the other end of the first coil conductor pattern CP12 is connected to the external electrode P2 through the interlayer connection conductor V8.

As mainly shown in FIG. 3, the second coil conductor pattern CP21 is disposed adjacent to the first coil conductor pattern CP11 in the Z-axis direction. In addition, the second coil conductor pattern CP22 is disposed adjacent to the first coil conductor patterns CP11 and CP12 in the Z-axis direction. In the present preferred embodiment, the first coil conductor patterns CP11 and CP12 and the second coil conductor patterns CP21 and CP22 are alternately disposed in the Z-axis direction.

The second coil conductor pattern CP21, as mainly shown in FIG. 2, includes a wide portion WP1 with a line width larger than a line width of the first coil conductor patterns CP11 and CP12. The entirety or substantially the entirety of the second coil conductor pattern CP21 according to the present preferred embodiment is the wide portion WP1. As mainly shown in FIG. 3, the wide portion WP1 includes an overlapping portion OP1 that overlaps with an adjacent first coil conductor pattern CP11 when viewed in the Z-axis direction, and a non-overlapping portion NOP1 that does not overlap with the adjacent first coil conductor pattern CP11. The non-overlapping portion NOP1 according to the present preferred embodiment is curved so as to be closer to the first coil conductor pattern CP11 than the overlapping portion OP1.

The second coil conductor pattern CP21 according to the present preferred embodiment is an "outermost layer-side coil conductor pattern" located closest to a main surface (the first main surface VS1 or the second main surface VS2) in the Z-axis direction, among the plurality of coil conductor patterns.

The second coil conductor pattern CP22, as mainly shown in FIG. 2, includes a wide portion WP2 with a line width larger than a line width of the first coil conductor patterns CP11 and CP12. The entirety or substantially the entirety of the second coil conductor pattern CP22 according to the present preferred embodiment is the wide portion WP2. As mainly shown in FIG. 3, the wide portion WP2 includes an overlapping portion OP2 that overlaps with adjacent first coil conductor patterns CP11 and CP12 when viewed in the Z-axis direction, and a non-overlapping portion NOP2 that does not overlap with the adjacent first coil conductor patterns CP11 and CP12. The overlapping portion OP2 also overlaps with the external electrodes P1 and P2, when viewed in the Z-axis direction. On the other hand, the non-overlapping portion NOP2 does not overlap with the external electrodes P1 and P2, when viewed in the Z-axis direction. The non-overlapping portion NOP2 according to the present preferred embodiment is curved so as to be closer to the first coil conductor pattern CP12 and the external electrodes P1 and P2 than the overlapping portion OP2.

The second coil conductor pattern CP22 according to the present preferred embodiment is located (disposed closest to the external electrodes P1 and P2 in the Z-axis direction) closest to the external electrodes P1 and P2 in the Z-axis direction, among the second coil conductor patterns CP21 and CP22. In addition, in the present preferred embodiment, the overlapping portion OP2 corresponds to an "electrode overlapping portion", and the non-overlapping portion NOP2 corresponds to an "electrode non-overlapping portion".

Moreover, as shown in FIG. 3, the non-overlapping portions NOP1 and NOP2 of the two adjacent second coil conductor patterns CP21 and CP22 in the Z-axis direction protrude in opposite directions in the radial direction (a direction parallel or substantially parallel to an XY plane and a radiation direction around the winding axis AX, for example, the X-axis direction in FIG. 3) of the second coil conductor patterns CP21 and CP22, with respect to the first coil conductor patterns CP11 and CP12. More specifically, the non-overlapping portion NOP1 of the second coil conductor pattern CP21 protrudes more to an outer peripheral side than the first coil conductor pattern CP11, and the non-overlapping portion NOP2 of the second coil conductor pattern CP22 protrudes more to an inner peripheral side than the first coil conductor patterns CP11 and CP12.

According to the multilayer resin substrate 101 of the present preferred embodiment, the following advantageous effects are obtained.

(a) In the present preferred embodiment, as mainly shown in FIG. 3, the non-overlapping portions NOP1 and NOP2 of the two adjacent second coil conductor patterns CP21 and CP22 in the stacking direction (the Z-axis direction) significantly protrude in opposite directions in the radial direction, with respect to the first coil conductor patterns CP11 and CP12. According to such a configuration, the non-overlapping portions NOP1 and NOP2 of the two adjacent second coil conductor patterns CP21 and CP22 in the Z-axis direction have little overlap. Therefore, the unwanted capacitance that may be generated between the non-overlapping portions NOP1 and NOP2 of the two adjacent second coil conductor patterns CP21 and CP22 in the Z-axis direction is significantly reduced or prevented.

In addition, in the present preferred embodiment, the non-overlapping portions NOP1 and NOP2 of the two adjacent second coil conductor patterns CP21 and CP22 in the Z-axis direction do not overlap with each other, when viewed in the Z-axis direction. For example, in a case in which the wide portion WP1 of the second coil conductor pattern CP21 shown in FIG. 3 also protrudes to the inner peripheral side in the radial direction to a certain extent (or in a case in which the wide portion WP2 of the second coil conductor pattern CP22 also protrudes to the outer peripheral side in the radial direction to a certain extent), the non-overlapping portions NOP1 and NOP2 may partially overlap with each other in the Z-axis direction to generate capacitance. On the other hand, according to the above-described configuration, the non-overlapping portions NOP1 and NOP2 do not overlap with each other when viewed in the Z-axis direction, so that the unwanted capacitance that may be generated between the wide portions WP1 and WP2 is further significantly reduced or prevented.

(b) In general, a coil conductor pattern with a small line width is more prone to displacement, deformation, or the like with the flow of resin at the time of thermocompression bonding than a coil conductor pattern with a large line width. On the other hand, in the present preferred embodiment, the non-overlapping portion NOP1 of the second coil conductor pattern CP21 is curved so as to be closer to the first coil conductor pattern CP11 than the overlapping portion OP1, and the non-overlapping portion NOP2 of the second coil conductor pattern CP22 is curved so as to be closer to the first coil conductor pattern CP12 than the overlapping portion OP2. According to this configuration, the flow of resin near the first coil conductor patterns CP11 and CP12 that easily flow at the time of thermocompression bonding is significantly reduced or prevented by the curved non-overlapping portions NOP1 and NOP2. Therefore, displacement or the like of the first coil conductor patterns CP11 and CP12 with the flow of resin at the time of thermocompression bonding is significantly reduced or prevented. In addition, according to this configuration, since the non-overlapping portions NOP1 and NOP2 are curved, compared with a case in which the non-overlapping portions NOP1 and NOP2 are not curved, displacement or the like of the second coil conductor patterns CP21 and CP22 themselves at the time of thermocompression bonding is difficult to occur.

(c) In addition, in general, an area near a surface layer of a stacked body is easily affected by heat from a pressing machine at the time of thermocompression bonding, and a coil conductor pattern (or an external electrode or the like) disposed near the surface layer of the stacked body is easily displaced at the time of thermocompression bonding. In the present preferred embodiment, the second coil conductor pattern CP21 is an outermost layer-side coil conductor pattern (a coil conductor pattern located closest to a main surface in the stacking direction, among a plurality of coil conductor patterns). As described above, the second coil conductor pattern CP21 includes a wide portion WP1 with a relatively large line width. Therefore, according to the configuration, in comparison with a case in which the outermost layer-side coil conductor pattern is the first coil conductor pattern, displacement of the outermost layer-side coil conductor pattern with the flow of resin at the time of thermocompression bonding is significantly reduced or prevented.

Furthermore, in the present preferred embodiment, the non-overlapping portion NOP1 of the outermost layer-side coil conductor pattern (the second coil conductor pattern CP21) is curved so as to be closer to the other coil conductor patterns (the first coil conductor patterns CP11 and CP12, and the second coil conductor pattern CP22) located on an inner layer side. According to this configuration, the non-overlapping portion NOP1 of the outermost layer-side coil conductor pattern is curved so as to be close to the other coil conductor patterns located on the inner layer side, so that the displacement of all of the plurality of coil conductor patterns at the time of thermocompression bonding is significantly reduced or prevented.

(d) Furthermore, in the present preferred embodiment, among the plurality of second coil conductor patterns CP21 and CP22, the non-overlapping portion NOP2 (the electrode non-overlapping portion) of the second coil conductor pattern CP22 located closest to the external electrodes P1 and P2 in the Z-axis direction is curved so as to be closer to the external electrodes P1 and P2 than the overlapping portion OP2 (the electrode overlapping portion). As described above, the external electrodes P1 and P2 disposed near the second main surface VS2 are easily displaced with the flow of resin at the time of thermocompression bonding. In contrast, according to the configuration, flow of resin near the external electrodes P1 and P2 that easily flow at the time of thermocompression bonding is significantly reduced or prevented by the non-overlapping portion NOP2 curved so as to be close to the external electrodes P1 and P2 (the second main surface VS2), and, as a result, displacement of the external electrodes P1 and P2 is significantly reduced or prevented.

(e) As with the multilayer resin substrate 101 according to the present preferred embodiment, in a case in which internal and external shapes of the second coil conductor pattern are rectangular or substantially rectangular (polygonal shapes), the non-overlapping portion provided for a certain one second coil conductor pattern is preferably disposed on at least two sides (a left side and a right side of the second coil conductor pattern CP21 in FIG. 2, for example) that face each other when viewed in the Z-axis direction. According to this configuration, the displacement of a coil (or a coil conductor pattern) with the flow of resin at the time of thermocompression bonding is effectively reduced or prevented by the non-overlapping portion provided on the two sides that face each other.

(f) In addition, as with the multilayer resin substrate 101 according to the present preferred embodiment, in the case in which the internal and external shapes of the second coil conductor pattern are rectangular or substantially rectangular (polygonal shapes), the non-overlapping portion provided for one certain second coil conductor pattern is preferably disposed on three or more sides, when viewed in the Z-axis direction. According to this configuration, in comparison with a case in which the non-overlapping portion is provided on the two sides, when viewed in the Z-axis direction, the advantageous effect of significantly reducing or preventing the displacement of a coil by the non-overlapping portion is further increased.

While the present preferred embodiment shows an example in which the internal and external shapes of the coil conductor pattern (the first coil conductor pattern and the second coil conductor pattern) are rectangular or substantially rectangular (polygonal shapes), the multilayer resin substrate of the present invention is not limited to such a configuration. The internal and external shapes of the coil conductor pattern are able to be appropriately changed, and may be a circular or substantially circular shape, an elliptical or substantially elliptical shape, an L shape, or a suitable shape, for example. In such a case, the non-overlapping portion provided for one certain second coil conductor pattern is preferably located in at least two directions among four orthogonal or substantially orthogonal directions (a positive X direction, a positive Y direction, a negative X direction, and a negative Y direction, for example) when viewed in the Z-axis direction, with respect to the winding axis AX of the coil. In particular, in a case in which the non-overlapping portion is located in each of the two parallel or substantially parallel directions (the positive X direction and the negative X direction, for example) among the four orthogonal or substantially orthogonal directions when viewed in the Z-axis direction, with respect to the winding axis AX, the displacement of the coil with the flow of resin at the time of thermocompression bonding is effectively reduced or prevented.

In addition, in a case in which the advantageous effect of significantly reducing or preventing the displacement of a coil at the time of thermocompression bonding is desired to be further increased, the non-overlapping portion, when viewed in the Z-axis direction, is preferably disposed (located in at least three directions among the four orthogonal or substantially orthogonal directions when viewed in the Z-axis direction) so as to surround the winding axis AX. As a result, the advantageous effect of significantly reducing or preventing the displacement of a coil by the non-overlapping portion is further increased.

While the present preferred embodiment shows the multilayer resin substrate 101 in which the non-overlapping portion is provided over an entire or substantially an entire length of one second coil conductor pattern, the multilayer resin substrate of the present invention is not limited to such a configuration. When the non-overlapping portion provided for one certain second coil conductor pattern is provided over about one-fifth or more of an entire length of the second coil conductor pattern, the advantageous functions and effects of the present invention are obtained. Furthermore, the number of turns of each of the first coil conductor pattern and the second coil conductor pattern is not limited to one and may be different for each coil conductor pattern.

Figure 4:
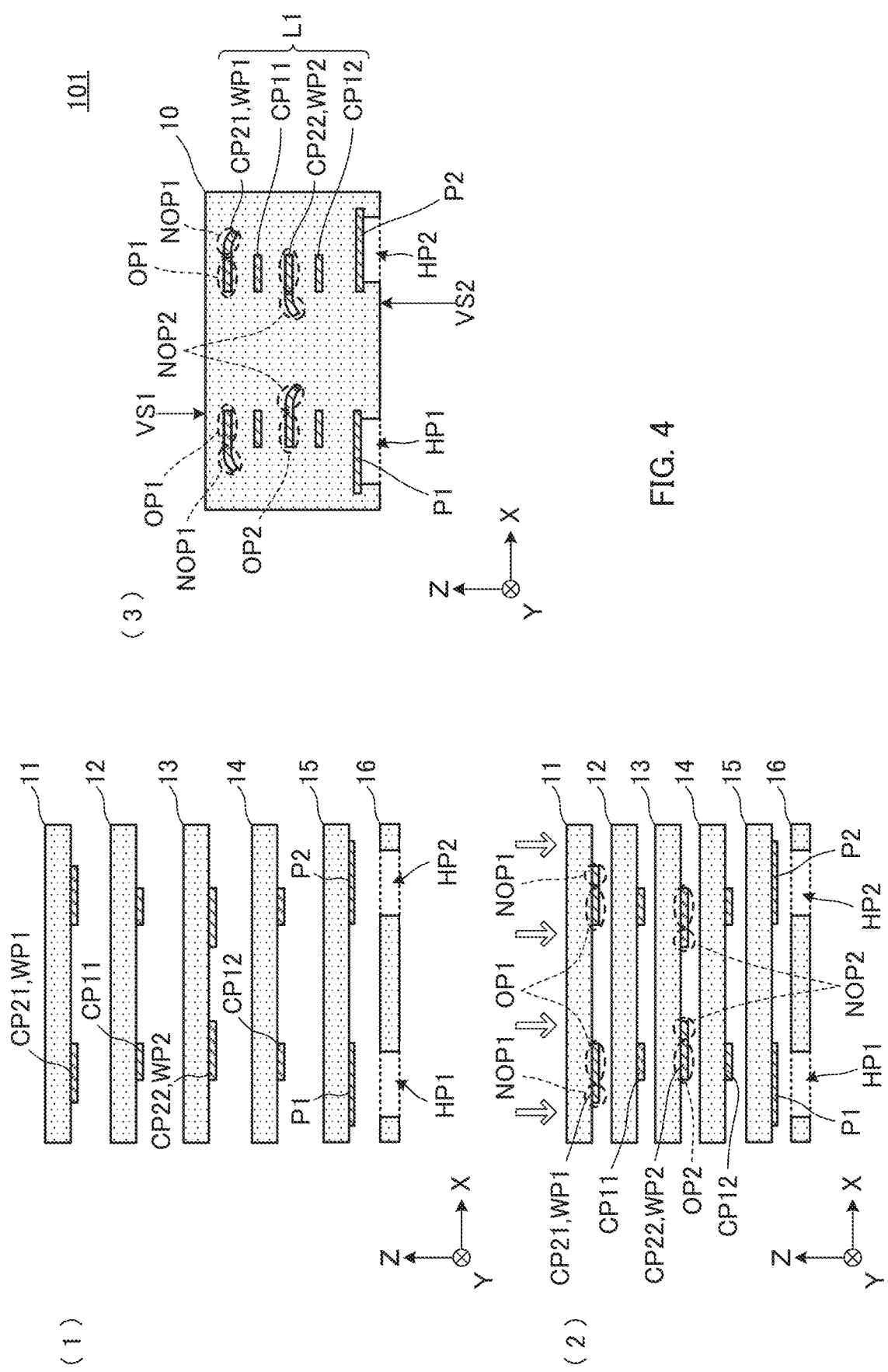
FIG. 4 is a cross-sectional view sequentially showing a process of manufacturing the multilayer resin substrate 101 according to a preferred embodiment of the present invention.

The multilayer resin substrate 101 according to the present preferred embodiment is manufactured by, for example, the following non-limiting manufacturing method. FIG. 4 is a cross-sectional view sequentially showing a process of manufacturing the multilayer resin substrate 101. In FIG. 4, for the sake of convenience of explanation, although the explanation will be provided in a manufacturing process for one chip (an individual piece), the actual process of manufacturing the multilayer resin substrate 101 is performed in a collective substrate state. The "collective substrate" refers to a substrate including a plurality of multilayer resin substrates 101. The same applies to each cross-sectional view showing the subsequent manufacturing steps of the multilayer resin substrate.

First, as shown in (1) in FIG. 4, a plurality of resin layers 11, 12, 13, 14, 15, and 16 are prepared. The resin layers 11 to 16 are sheets made of a material, such as a liquid crystal polymer (LCP) or a polyether ether ketone (PEEK), for example.

Subsequently, a plurality of coil conductor patterns (the first coil conductor patterns CP11 and CP12, and the second coil conductor patterns CP21 and CP22), the external electrodes P1 and P2, and the like are formed on the resin layers 11 to 15. Specifically, metal foil (Cu foil, for example) is laminated on a back surface of the resin layers 11 to 15, and is patterned by photolithography, for example. As a result, the second coil conductor pattern CP21 is formed on the back surface of the resin layer 11, the first coil conductor pattern CP11 is formed on the back surface of the resin layer 12, the second coil conductor pattern CP22 is formed on the back surface of the resin layer 13, and the first coil conductor pattern CP12 is formed on the back surface of the resin layer 14. In addition, the external electrodes P1 and P2 are formed on the back of the resin layer 15.

The second coil conductor pattern CP21 includes a wide portion WP1 and the second coil conductor pattern CP22 includes a wide portion WP2. The wide portions WP1 and WP2 are portions having a line width larger than a line width of the first coil conductor patterns CP11 and CP12.

As described above, this step of forming the plurality of coil conductor patterns (the first coil conductor patterns CP11 and CP12, and the second coil conductor patterns CP21 and CP22 including the wide portions WP1 and WP2), respectively, on the three or more resin layers 11 to 14 is an example of the "coil conductor forming step".

In addition, interlayer connection conductors (interlayer connection conductors V1 to V8 in FIG. 2) are formed in the resin layers 11 to 15. The interlayer connection conductors are provided by forming a hole by laser irradiation, a drill, or the like, for example, and then providing (filling) the hole with conductive paste including, for example, metal powder including Cu and Sn or an alloy including Cu and Sn, and a resin material and solidifying the conductive paste by the subsequent thermocompression bonding.

Furthermore, opening portions HP1 and HP2 are formed in the resin layer 16. The opening portion HP1 is a rectangular or substantially rectangular through hole disposed in the vicinity of a first side (a left side of the resin layer 16 in FIG. 4) of the resin layer 16, and the opening portion HP2 is a rectangular or substantially rectangular through hole disposed in the vicinity of a second side (a right side of the resin layer 16 in FIG. 4) of the resin layer 16. The opening portions HP1 and HP2 are formed by etching the resin layer 16, for example, by a laser or the like. In addition, the opening portions HP1 and HP2 may be formed by, for example, punching or the like.

Next, as shown in (2) in FIG. 4, the resin layers 16, 15, 14, 13, 12, and 11 are sequentially disposed (placed) on each other. At this time, the wide portion WP1 of the second coil conductor pattern CP21, when viewed in the stacking direction (the Z-axis direction), is divided into the overlapping portion OP1 that overlaps with the first coil conductor patterns CP11 and CP12, and the non-overlapping portion NOP1 that does not overlap with the first coil conductor patterns CP11 and CP12. In addition, the wide portion WP2 of the second coil conductor pattern CP22, when viewed in the Z-axis direction, is divided into the overlapping portion OP2 that overlaps with the first coil conductor patterns CP11 and CP12, and the non-overlapping portion NOP2 that does not overlap with the first coil conductor patterns CP11 and CP12. Moreover, the non-overlapping portions NOP1 and NOP2 of the two adjacent second coil conductor patterns CP21 and CP22 in the Z-axis direction protrude in opposite directions in the radial direction (the X-axis direction in FIG. 4, for example) of the second coil conductor patterns CP21 and CP22, with respect to the first coil conductor patterns CP11 and CP12.

This step of stacking the plurality of resin layers 11 to 16 after the "coil conductor forming step," and thus causing the non-overlapping portions NOP1 and NOP2 of the two adjacent second coil conductor patterns CP21 and CP22 in the Z-axis direction to protrude in the opposite directions in the radial direction, with respect to the first coil conductor patterns CP11 and CP12, is an example of the "stacking step".

Subsequently, the plurality of resin layers 11 to 16 that have been stacked are thermally compressed (collectively pressed) to form the stacked body 10 (the multilayer resin substrate 101) shown in (3) in FIG. 4. Specifically, the stacked resin layers 11 to 16, while being heated, are subjected to quasi-isostatic pressing (pressurization) from a direction of the white arrow shown in (2) in FIG. 4.

At this time, the non-overlapping portions NOP1 and NOP2 of the second coil conductor patterns CP21 and CP22 overlap fewer conductor patterns when viewed in the Z-axis direction than the overlapping portions OP1 and OP2. Therefore, in comparison with the resin near the overlapping portions OP1 and OP2, the resin near the non-overlapping portions NOP1 and NOP2 at the time of thermocompression bonding is easy to deform. Accordingly, the non-overlapping portion NOP1 of the second coil conductor pattern CP21 is curved so as to be closer to the first coil conductor pattern CP11 than the overlapping portion OP1. In addition, the non-overlapping portion NOP2 of the second coil conductor pattern CP22 is curved so as to be closer to the first coil conductor pattern CP12 than the overlapping portion OP2.

This step of thermally compressing, after the "stacking step," the stacked resin layers 11 to 16 to form the stacked body 10, and causing the non-overlapping portion NOP1 of at least one second coil conductor pattern CP21 to be curved so as to be closer to the first coil conductor pattern CP11 than the overlapping portion OP1 is an example of the "stacked body forming step."

According to the manufacturing method described above, even with the configuration including the coil L1 in which the plurality of non-overlapping portions NOP1 and NOP2 are provided, the multilayer resin substrate 101 capable of significantly reducing or preventing a change in electrical characteristics of the coil due to unwanted capacitance that may be generated between the non-overlapping portions NOP1 and NOP2 is able to be easily obtained.

Figure 5:
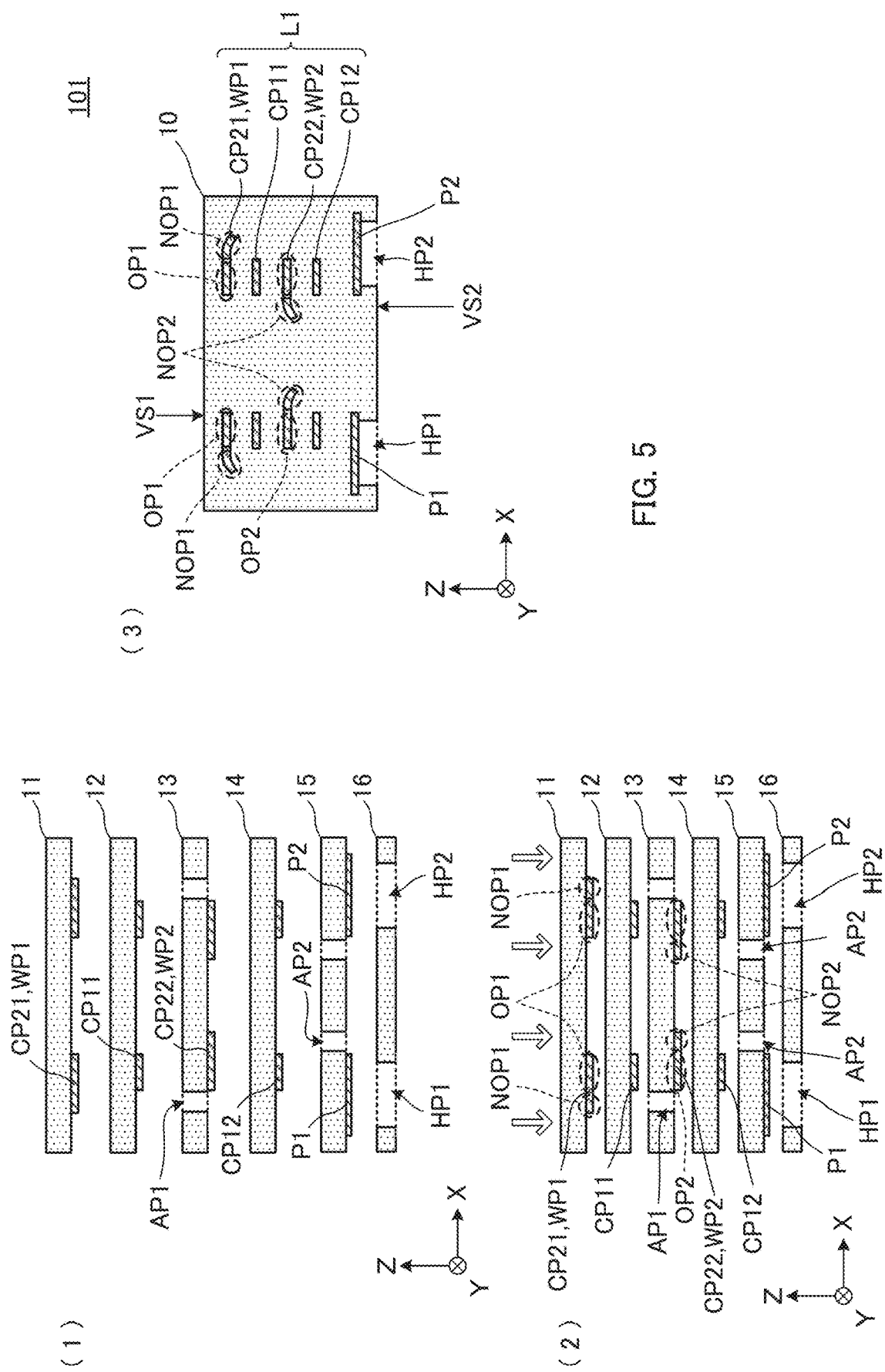
FIG. 5 is a cross-sectional view sequentially showing another process of manufacturing the multilayer resin substrate 101.

In addition, the multilayer resin substrate 101 may be manufactured by, for example, the following non-limiting manufacturing method. FIG. 5 is a cross-sectional view sequentially showing another process of manufacturing the multilayer resin substrate 101.

First, as shown in (1) in FIG. 5, a plurality of resin layers 11 to 16 are prepared. Subsequently, a plurality of coil conductor patterns (the first coil conductor patterns CP11 and CP12, and the second coil conductor patterns CP21 and CP22), the external electrodes P1 and P2, and the like are formed on the resin layers 11 to 15 (the coil conductor forming step).

In addition, interlayer connection conductors (interlayer connection conductors V1 to V8 in FIG. 2) are formed in the resin layers 11 to 15, and opening portions HP1 and HP2 are formed in the resin layer 16.

Subsequently, an opening AP1 with a predetermined shape is formed in the resin layer 13, and an opening AP2 with a predetermined shape is formed in the resin layer 15. The opening AP1 is a through hole having the same or substantially the same shape as the non-overlapping portion NOP1 of the second coil conductor pattern CP21. The opening AP2 is a through hole having the same or substantially the same shape as the non-overlapping portion NOP2 of the second coil conductor pattern CP22.

This step of forming, before the "stacking step," the openings AP1 and AP2 of a predetermined shape in the resin layers 13 and 15 (any of the plurality of resin layers 11 to 16) is an example of an "opening forming step".

Next, as shown in (2) in FIG. 5, the resin layers 16, 15, 14, 13, 12, and 11 are sequentially disposed on each other (the stacking step). At this time, the plurality of resin layers 11 to 16 are stacked on each other so that, when viewed in the Z-axis direction, the opening AP1 may overlap with the non-overlapping portion NOP1 and the opening AP2 may overlap with the non-overlapping portion NOP2. It is to be noted that, when the plurality of resin layers 11 to 16 are stacked, at least one resin layer 12 is interposed between the non-overlapping portion NOP1 and the opening AP1, and at least one resin layer 14 is interposed between the non-overlapping portion NOP2 and the opening AP2.

Subsequently, the plurality of resin layers 11 to 16 that have been stacked are thermally compressed (collectively pressed) to form the stacked body 10 (the multilayer resin substrate 101) shown in (3) in FIG. 5 (the stacked body forming step).

According to the manufacturing method described above, the openings (the through holes) AP1 and AP2 are provided at positions that overlap with the non-overlapping portions NOP1 and NOP2 of the second coil conductor patterns CP21 and CP22, so that a direction in which the non-overlapping portion NOP1 is curved at the time of thermocompression bonding is easily controlled.

Furthermore, according to the manufacturing method described above, an occurrence of a short circuit due to the curve of the non-overlapping portions NOP1 and NOP2 at the time of thermocompression bonding is able to be significantly reduced or prevented. For example, in a case in which the opening (the through hole) AP1 is provided in the resin layer 12 in contact with the non-overlapping portion NOP1, the non-overlapping portion NOP1 may be curved at the time of thermocompression bonding, and thus may come into contact with the first coil conductor pattern CP11 and cause a short circuit. In contrast, according to the present manufacturing method, in a state in which the resin layer 12 is interposed between the non-overlapping portion NOP1 and the opening AP1 (the resin layer 14 is interposed between the non-overlapping portion NOP2 and the opening AP2), by thermally compressing the plurality of resin layers 11 to 16, the short circuit due to the curve of the non-overlapping portions NOP1 and NOP2 at the time of thermocompression bonding is able to be significantly reduced or prevented.

Figure 6:
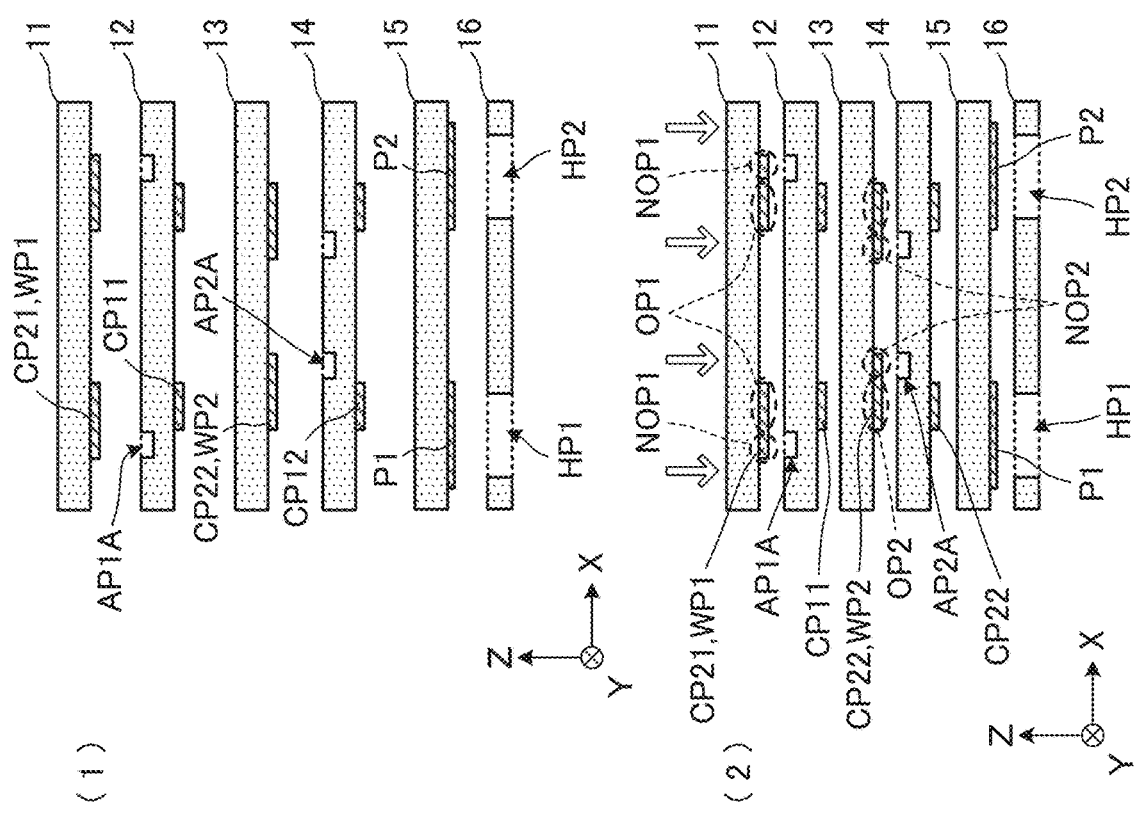
FIG. 6 is a cross-sectional view sequentially showing another process of manufacturing the multilayer resin substrate 101.

Furthermore, the multilayer resin substrate 101 may be manufactured by, for example, the following non-limiting manufacturing method. FIG. 6 is a cross-sectional view sequentially showing another process of manufacturing the multilayer resin substrate 101.

First, as shown in (1) in FIG. 6, a plurality of resin layers 11 to 16 are prepared. Subsequently, a plurality of coil conductor patterns (the first coil conductor patterns CP11 and CP12, and the second coil conductor patterns CP21 and CP22), the external electrodes P1 and P2, and the like are formed on the resin layers 11 to 15 (the coil conductor forming step).

In addition, interlayer connection conductors (interlayer connection conductors V1 to V8 in FIG. 2) are formed in the resin layers 11 to 15, and opening portions HP1 and HP2 are formed in the resin layer 16.

Subsequently, an opening AP1A of a predetermined shape is formed in a front surface of the resin layer 12, and an opening AP2A of a predetermined shape is formed in a front surface of the resin layer 14 (the opening forming step). The opening AP1A is a recessed portion (a groove) having the same or substantially the same shape as the non-overlapping portion NOP1 of the second coil conductor pattern CP21. The opening AP2A is a recessed portion (a groove) having the same or substantially the same shape as the non-overlapping portion NOP2 of the second coil conductor pattern CP22.

Next, as shown in (2) in FIG. 6, the resin layers 16, 15, 14, 13, 12, and 11 are sequentially disposed on each other (the stacking step). At this time, the plurality of resin layers 11 to 16 are stacked on each other so that, when viewed in the Z-axis direction, the opening AP1A may overlap with the non-overlapping portion NOP1 and the opening AP2A may overlap with the non-overlapping portion NOP2.

Subsequently, the plurality of resin layers 11 to 16 that have been stacked are thermally compressed (collectively pressed) to form the stacked body 10 (the multilayer resin substrate 101) shown in (3) in FIG. 6 (the stacked body forming step).

In the manufacturing method described above, the openings AP1A and AP2A being recessed portions (a groove) are provided at positions that overlap with the non-overlapping portions NOP1 and NOP2. As a result, in comparison with a case in which an opening (a through hole) is formed in a resin layer in contact with a non-overlapping portion, a short circuit due to the non-overlapping portions NOP1 and NOP2 curved at the time of thermocompression bonding is able to be significantly reduced or prevented. It is to be noted that the curved shape or the like (such as a curvature relative to an overlapping portion) of the non-overlapping portion is able to be adjusted, depending on a shape, a depth, or the like of the openings AP1A and AP2A being the recessed portions.

It is to be noted that, while the manufacturing method described above shows an example in which the opening AP1A being a recessed portion (a groove) is formed in the front surface of the resin layer 12 in contact with the non-overlapping portion NOP1, the multilayer resin substrate is not limited to such a manufacturing method. The opening AP1A may be formed, for example, in a back surface of the resin layer 12 or may be formed in both front and back surfaces of the resin layer 12. In addition, the opening AP1A may be formed in both front and back surfaces of the resin layer 13, for example.

Similarly, while the manufacturing method described above shows an example in which the opening AP2A being a recessed portion (a groove) is formed in the front surface of the resin layer 14 in contact with the non-overlapping portion NOP2, the multilayer resin substrate is not limited to such a manufacturing method. The opening AP2A may be formed, for example, in a back surface of the resin layer 14 or may be formed in both front and back surfaces of the resin layer 14.

Second Preferred Embodiment

A second preferred embodiment of the present invention shows an example of a multilayer resin substrate in which a coil (a plurality of coil conductor patterns) does not overlap with an external electrode, when viewed in a stacking direction.

Figure 7:
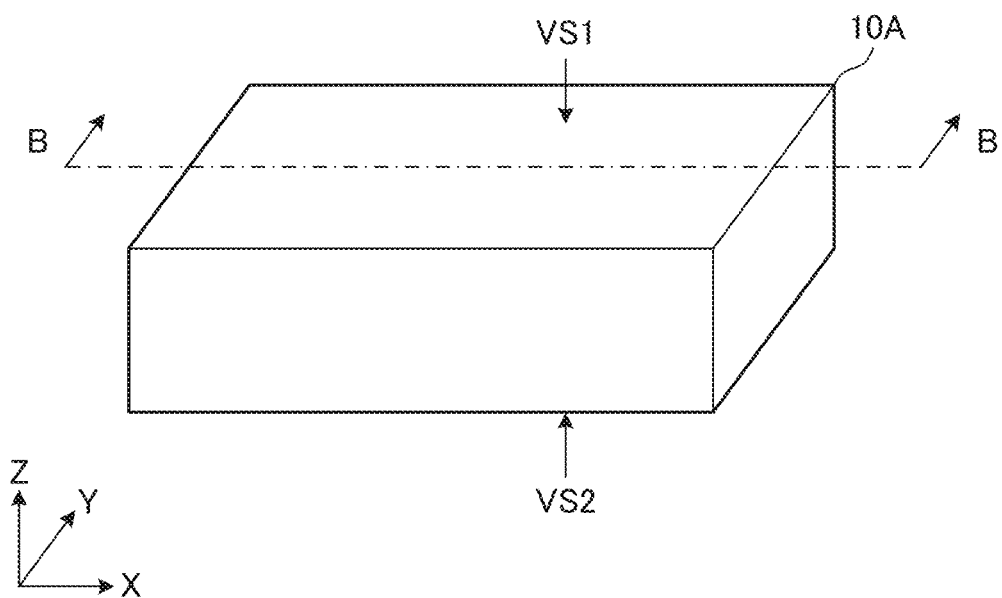
FIG. 7 is an external perspective view of a multilayer resin substrate 102 according to a second preferred embodiment of the present invention.
Figure 8:
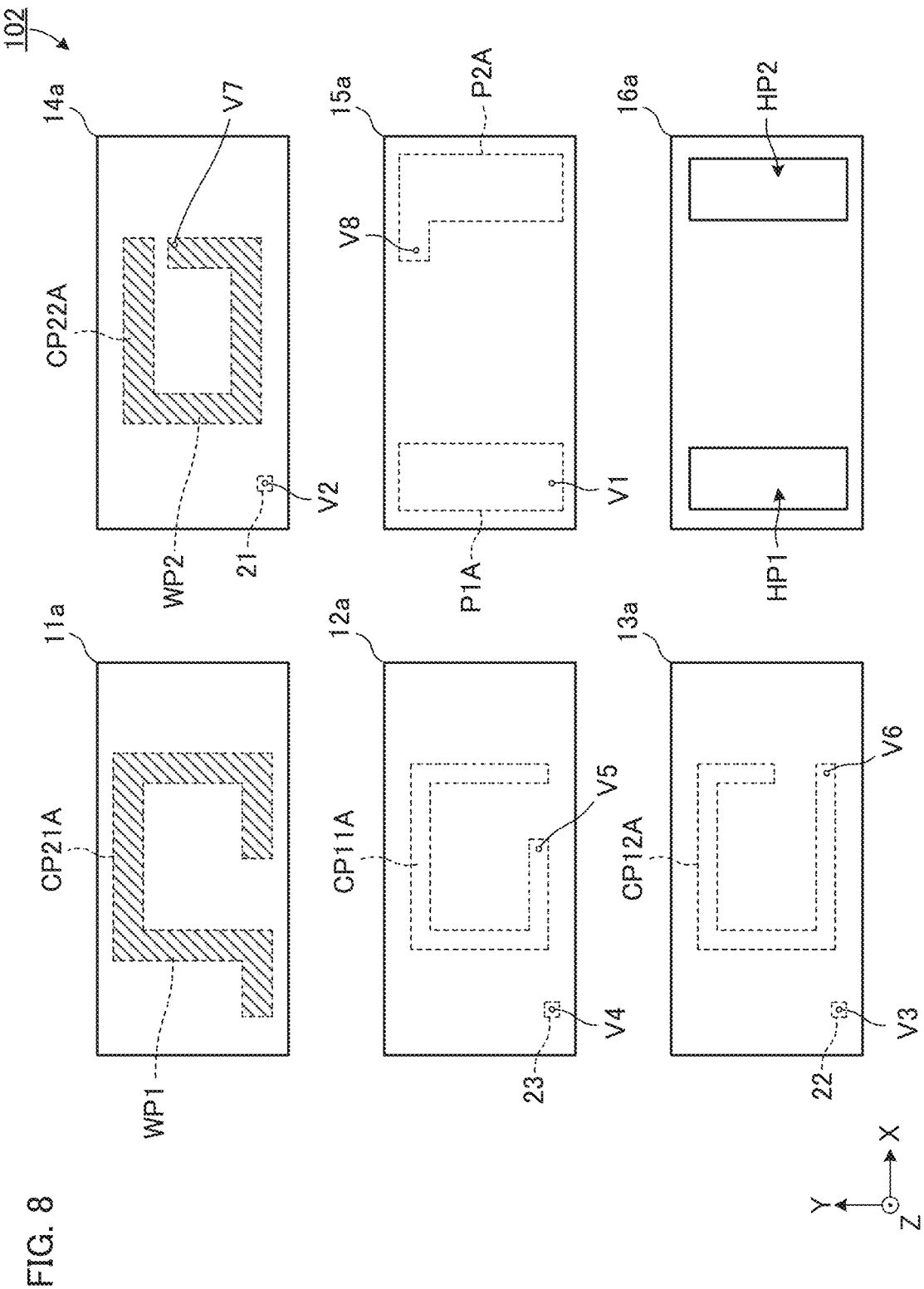
FIG. 8 is an exploded plan view of the multilayer resin substrate 102.
Figure 9:
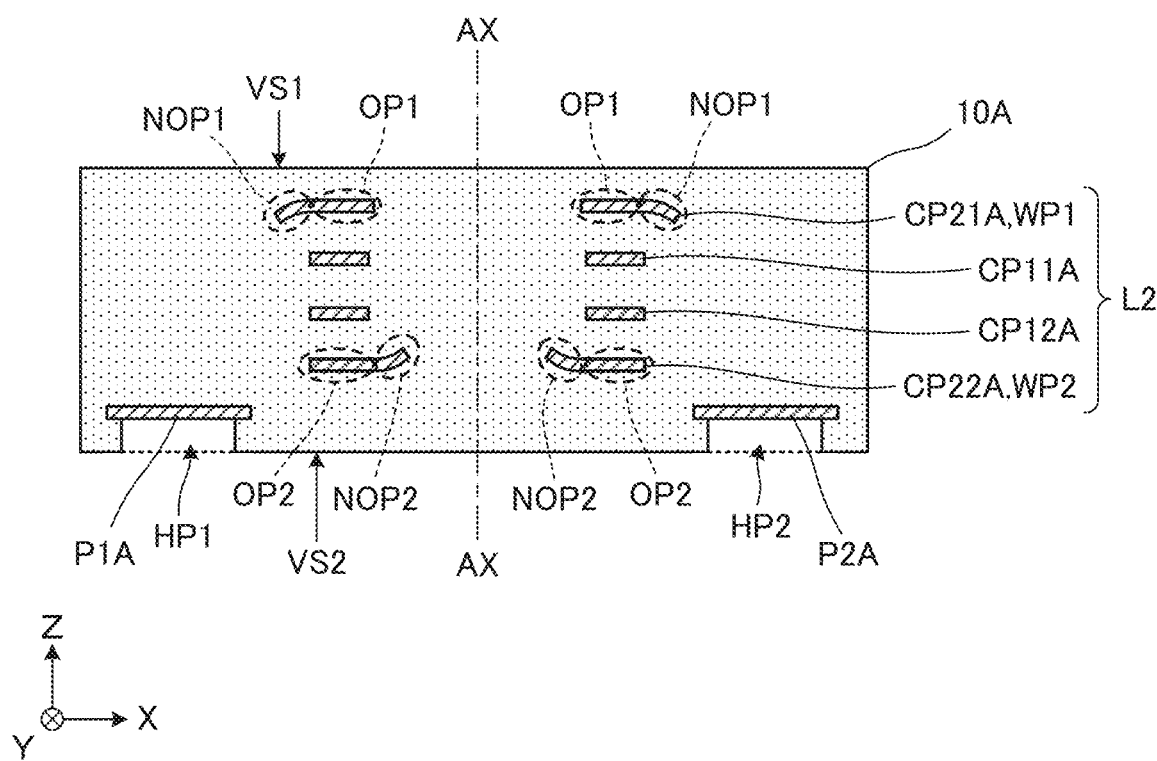
FIG. 9 is a B-B cross-sectional view in FIG. 7.

FIG. 7 is an external perspective view of a multilayer resin substrate 102 according to the second preferred embodiment of the present invention. FIG. 8 is an exploded plan view of the multilayer resin substrate 102. FIG. 9 is a B-B cross-sectional view in FIG. 7. In FIG. 9, in order to make the structure easy to understand, wide portions WP1 and WP2 of second coil conductor patterns CP21A and CP22A are indicated by hatching.

The multilayer resin substrate 102 includes a stacked body 10A, a coil L2, and external electrodes P1A and P2A. The stacked body 10A has a longer length in the longitudinal direction (the X-axis direction) than the stacked body 10 described in the first preferred embodiment. Other configurations of the stacked body 10A are the same or substantially the same as the configurations of the stacked body 10.

Hereinafter, differences from the multilayer resin substrate 101 according to the first preferred embodiment will be described.

The stacked body 10A is provided by sequentially stacking and thermally compressing resin layers 16a, 15a, 14a, 13a, 12a, and 11a. The resin layers 11a to 16a have a longer length in the longitudinal direction than the resin layers 11 to 16 described in the first preferred embodiment. Other configurations of the resin layers 11a to 16a are the same or substantially the same as the configurations of the resin layers 11 to 16.

The second coil conductor pattern CP21A is provided on a back surface of the resin layer 11a. The second coil conductor pattern CP21A has the same or substantially the same shape as the second coil conductor pattern CP21 described in the first preferred embodiment, and is disposed near the center in the longitudinal direction (the X-axis direction) of the resin layer 11a.

A first coil conductor pattern CP11A and a conductor pattern 23 are provided on a back surface of the resin layer 12.

The first coil conductor pattern CP11A has the same or substantially the same shape as the first coil conductor pattern CP11 described in the first preferred embodiment, and is disposed near the center in the longitudinal direction of the resin layer 12a. The conductor pattern 23 is the same or substantially the same as the conductor pattern described in the first preferred embodiment.

A first coil conductor pattern CP12A and a conductor pattern 22 are provided on a back surface of the resin layer 13a. The first coil conductor pattern CP12A is a rectangular or substantially rectangular loop-shaped conductor pattern of about one turn, and is disposed near the center in the longitudinal direction of the resin layer 13a. The conductor pattern 22 is the same or substantially the same as the conductor pattern described in the first preferred embodiment.

A second coil conductor pattern CP22A and a conductor pattern 21 are provided on a back surface of the resin layer 14a. The second coil conductor pattern CP22A is a rectangular or substantially rectangular loop-shaped conductor pattern of about one turn, and is disposed near the center in the longitudinal direction of the resin layer 14a. The conductor pattern 21 is the same or substantially the same as the conductor pattern described in the first preferred embodiment.

External electrodes P1A and P2A are provided on a back surface of the resin layer 15a. The external electrode P1A is the same or substantially the same as the external electrode P1 described in the first preferred embodiment. The external electrode P2A is an L-shaped conductor pattern disposed adjacent to or in the vicinity of a second end (a right end of the resin layer 15a in FIG. 8) of the resin layer 15a. In addition, opening portions HP1 and HP2 are provided in the resin layer 16a. The opening portions HP1 and HP2 are the same or substantially the same as the opening portions described in the first preferred embodiment.

As shown in FIG. 8, one end of the second coil conductor pattern CP21A is connected to one end of the first coil conductor pattern CP11A through the interlayer connection conductor V5, and the other end of the first coil conductor pattern CP11A is connected to one end of the first coil conductor pattern CP12A through the interlayer connection conductor V6. The other end of the first coil conductor pattern CP12A is connected to one end of the second coil conductor pattern CP22A through the interlayer connection conductor V7. As described above, a plurality of coil conductor patterns (one or more first coil conductor patterns CP11A and CP12A, and two or more second coil conductor patterns CP21A and CP22A) provided, respectively, on the three or more resin layers 11a to 14a and the interlayer connection conductors V5, V6, and V7 define the coil L2 having a winding axis AX in the Z-axis direction.

In addition, a first end of the coil L2 is connected to the external electrode P1A, and a second end of the coil L2 is connected to the external electrode P2A. Specifically, the other end of the second coil conductor pattern CP21A is connected to the external electrode P1A through the conductor patterns 21, 22, and 23 and the interlayer connection conductors V1, V2, V3, and V4. In addition, the other end of the second coil conductor pattern CP22A is connected to the external electrode P2A through the interlayer connection conductor V8.

As shown in FIG. 9, a large portion of the coil L2 according to the present preferred embodiment, when viewed in the Z-axis direction, does not overlap with the external electrodes P1A and P2A. In addition, in the present preferred embodiment, the second coil conductor pattern CP21A, the first coil conductor patterns CP11A and CP12A, and the second coil conductor pattern CP22A are sequentially disposed in a negative Z direction. In other words, the second coil conductor pattern CP21A is disposed adjacent to the first coil conductor pattern CP11A in the Z-axis direction, and the second coil conductor pattern CP22A is disposed adjacent to the first coil conductor pattern CP12A in the Z-axis direction.

In the present preferred embodiment, the second coil conductor pattern CP21A corresponds to a "first main surface-side coil conductor pattern" located closest to the first main surface VS1 in the Z-axis direction, among the plurality of coil conductor patterns. As shown in FIG. 9, the non-overlapping portion NOP1 of the second coil conductor pattern CP21A is curved so as to be close to the other coil conductor patterns (the first coil conductor patterns CP11A and CP12A) located on the inner layer side.

In addition, in the present preferred embodiment, the second coil conductor pattern CP22A corresponds to a "second main surface-side coil conductor pattern" located closest to the second main surface VS2 in the Z-axis direction, among the plurality of coil conductor patterns. As shown in FIG. 9, the non-overlapping portion NOP2 of the second coil conductor pattern CP22A is curved so as to be close to the other coil conductor patterns (the first coil conductor patterns CP11A and CP12A) located on the inner layer side.

It is to be noted that the non-overlapping portions NOP1 and NOP2 of the two adjacent second coil conductor patterns CP21A and CP22A in the Z-axis direction protrude in opposite directions in a radial direction (the X-axis direction in FIG. 9, for example), with respect to the first coil conductor patterns CP11A and CP12A.

With the multilayer resin substrate 102 according to the present preferred embodiment, the following advantageous effects in addition to the advantageous effects described in the first preferred embodiment are obtained.

In the present preferred embodiment, the non-overlapping portion NOP1 of the second coil conductor pattern CP21A (the first main surface-side coil conductor pattern) and the non-overlapping portion NOP2 of the second coil conductor pattern CP22A (the second main surface side coil conductor pattern) are curved so as to be close to the first coil conductor patterns CP11A and CP12A (the other coil conductor patterns) located on the inner layer side. According to such a configuration, the other coil conductor patterns located on the inner layer side are structured so as to be enclosed by the second coil conductor patterns (the first main surface-side coil conductor pattern and the second main surface-side coil conductor pattern), so that the displacement or the like of all of the plurality of coil conductor patterns at the time of thermocompression bonding is able to be further reduced or prevented.

It is to be noted that, while the present preferred embodiment shows an example in which both of the first main surface-side coil conductor pattern and the second main surface-side coil conductor pattern are the second coil conductor patterns, the multilayer resin substrate is not limited to such a configuration. For example, either one of the first main surface-side coil conductor pattern and the second main surface-side coil conductor pattern may be the first coil conductor pattern, or both of the first main surface-side coil conductor pattern and the second main surface-side coil conductor pattern may be the first coil conductor pattern.

Figure 10:
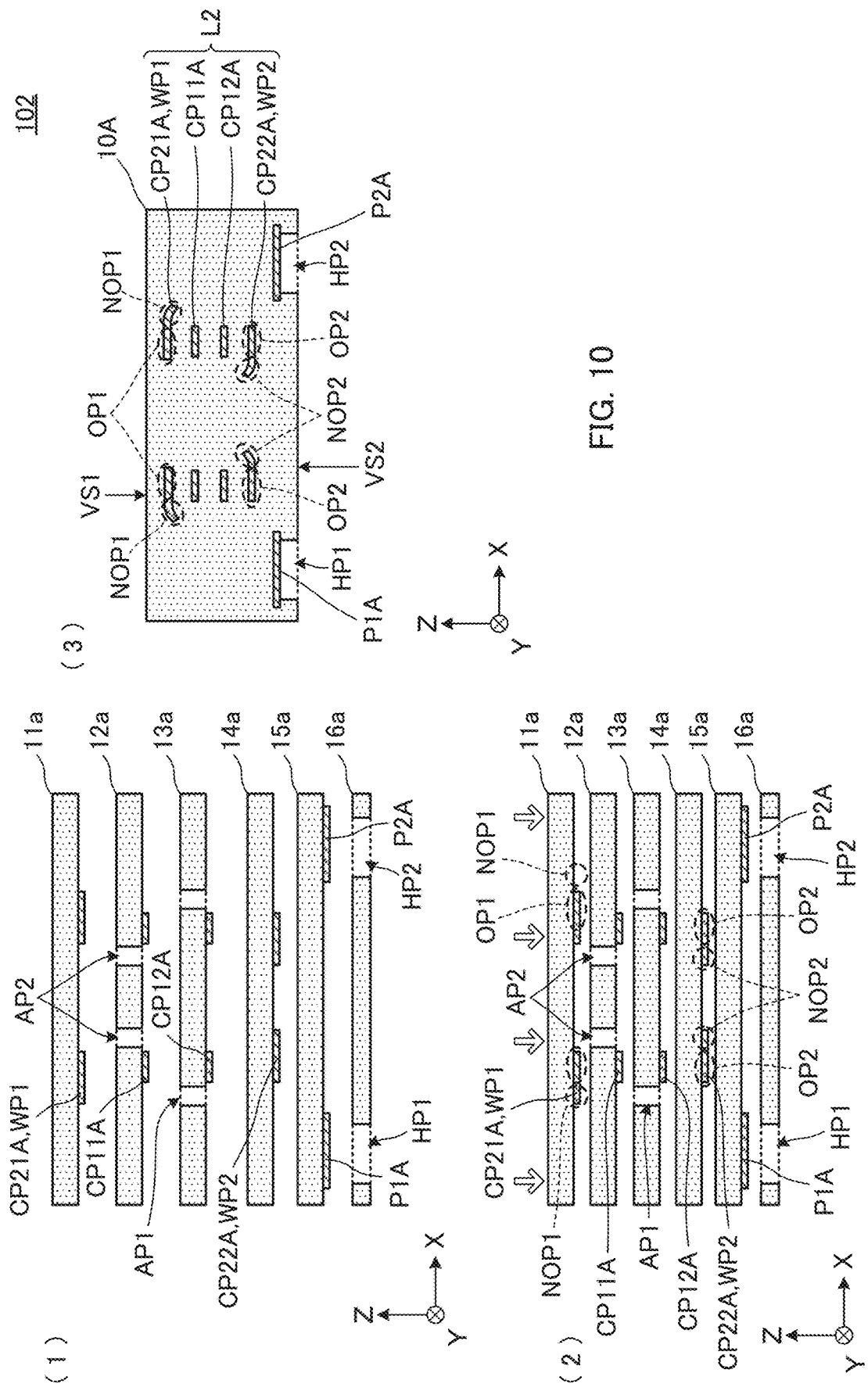
FIG. 10 is a cross-sectional view sequentially showing a process of manufacturing the multilayer resin substrate 102 according to a preferred embodiment of the present invention.

The multilayer resin substrate 102 may be manufactured by, for example, the following non-limiting manufacturing method. FIG. 10 is a cross-sectional view sequentially showing a process of manufacturing the multilayer resin substrate 102.

First, as shown in (1) in FIG. 10, a plurality of resin layers 11a to 16a are prepared. Subsequently, a plurality of coil conductor patterns (the first coil conductor patterns CP11A and CP12A, and the second coil conductor patterns CP21A and CP22A), the external electrodes P1A and P2A, and the like are formed on the resin layers 11a to 15a (the coil conductor forming step).

In addition, interlayer connection conductors (interlayer connection conductors V1 to V8 in FIG. 8) are formed in the resin layers 11a to 15a, and opening portions HP1 and HP2 are formed in the resin layer 16a.

Subsequently, an opening AP1A of a predetermined shape is formed in the resin layer 13a, and an opening AP2A of a predetermined shape is formed in the resin layer 12a (the opening forming step). The opening AP1 is a through hole having the same or substantially the same shape as the non-overlapping portion NOP1 of the second coil conductor pattern CP21A shown in (2) in FIG. 10. The opening AP2 is a through hole having substantially the same or substantially the same shape as the non-overlapping portion NOP2 of the second coil conductor pattern CP22A shown in (2) in FIG. 10.

Subsequently, as shown in (2) in FIG. 10, the resin layers 16a, 15a, 14a, 13a, 12a, and 11a are sequentially stacked on each other (the stacking step). At this time, the plurality of resin layers 11a to 16a are stacked on each other so that, when viewed in the Z-axis direction, the opening AP1 may overlap with the non-overlapping portion NOP1 and the opening AP2 may overlap with the non-overlapping portion NOP2. At this time, at least one resin layer 12a is interposed between the non-overlapping portion NOP1 and the opening AP1. At this time, at least one resin layer 13a is interposed between the non-overlapping portion NOP2 and the opening AP2.

Subsequently, the plurality of resin layers 11a to 16a that have been stacked are thermally compressed (collectively pressed) to form the stacked body 10A (the multilayer resin substrate 102) shown in (3) in FIG. 10 (the stacked body forming step).

Third Preferred Embodiment

A third preferred embodiment of the present invention shows an example of a multilayer resin substrate including a plurality of spiral-shaped coil conductor patterns.

Figure 11:
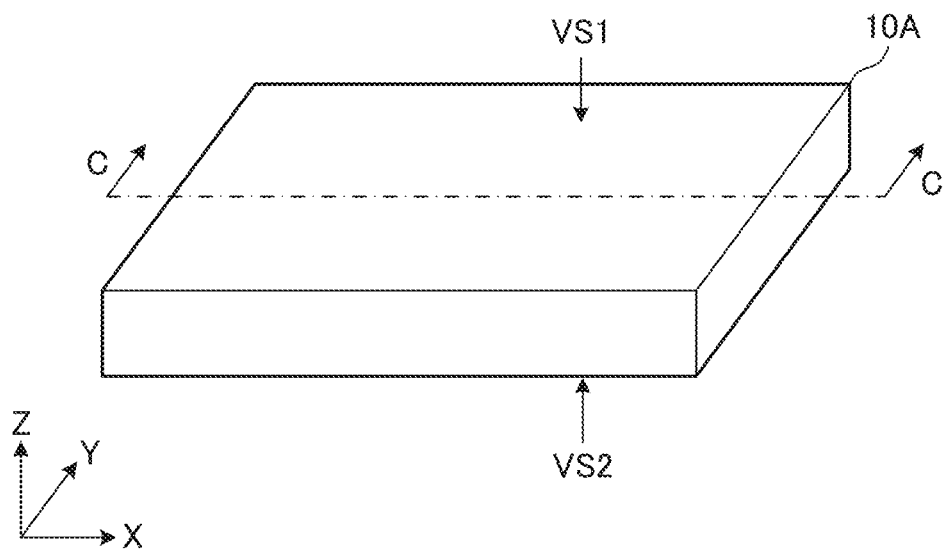
FIG. 11 is an external perspective view of a multilayer resin substrate 103 according to a third preferred embodiment of the present invention.
Figure 12:
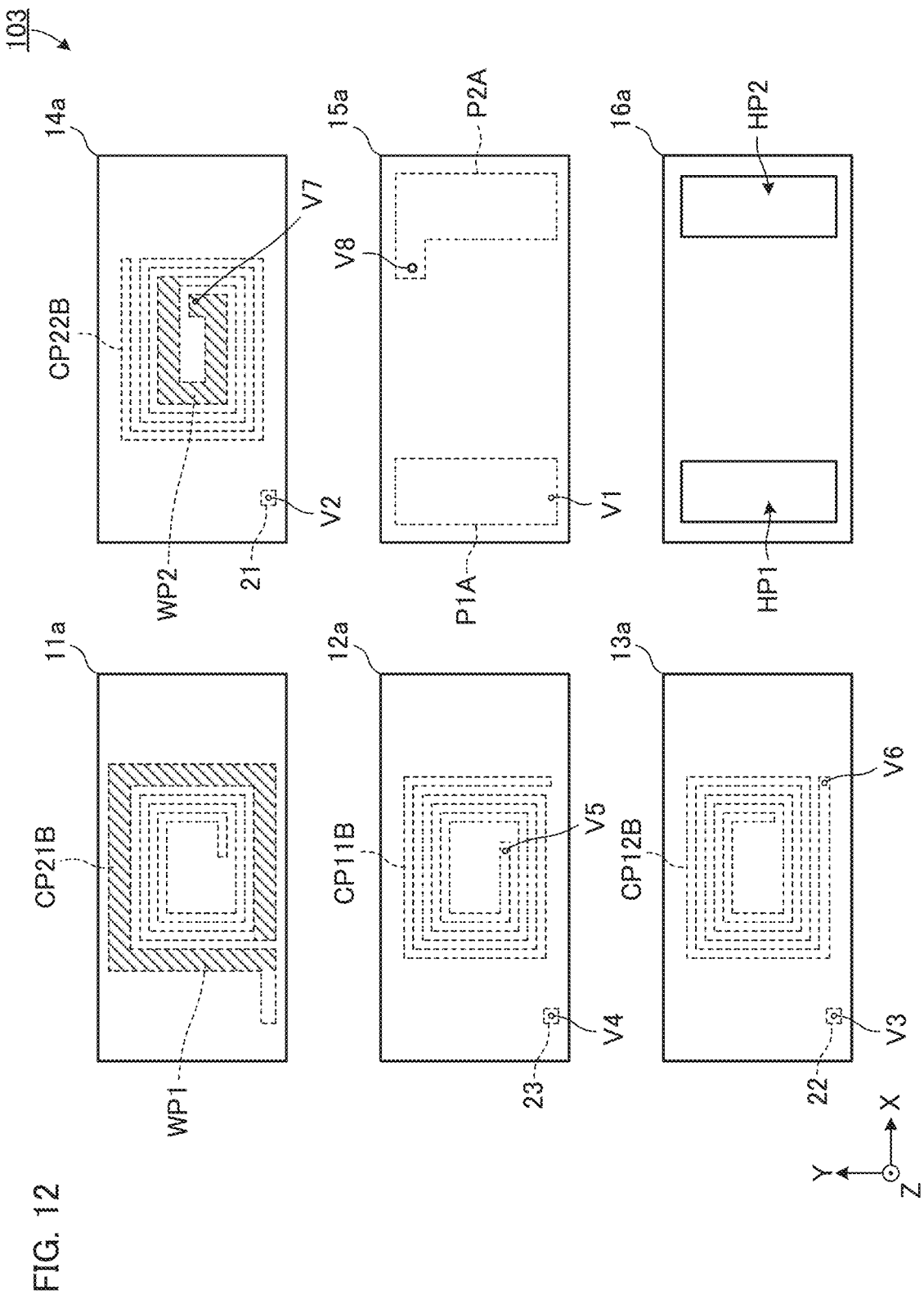
FIG. 12 is an exploded plan view of the multilayer resin substrate 103.
Figure 13:
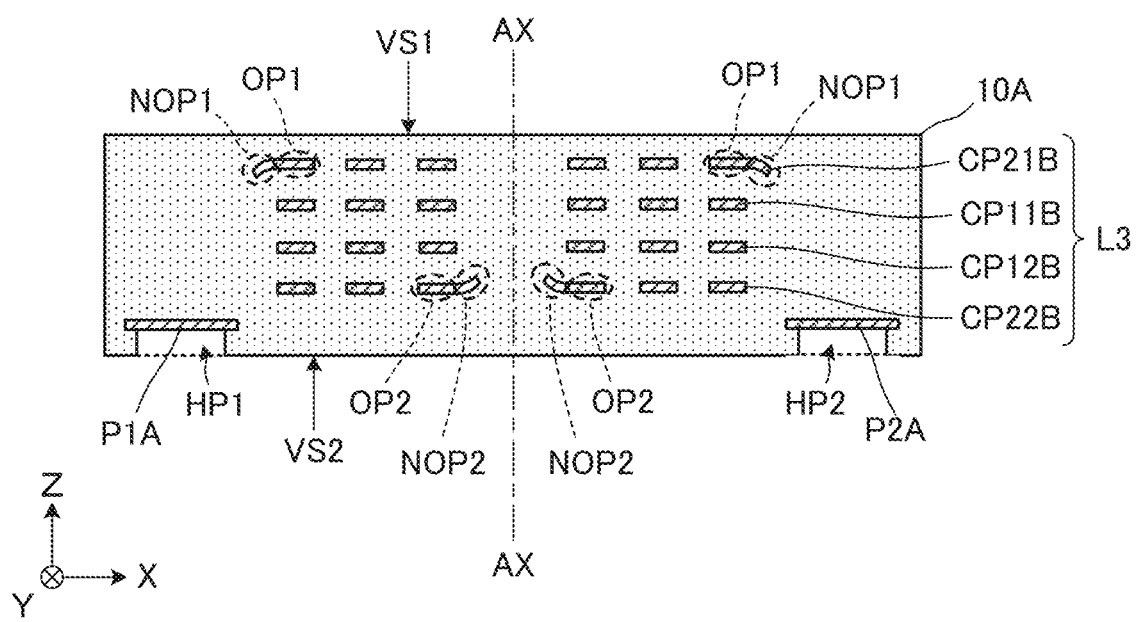
FIG. 13 is a C-C cross-sectional view in FIG. 11.

FIG. 11 is an external perspective view of a multilayer resin substrate 103 according to the third preferred embodiment of the present invention. FIG. 12 is an exploded plan view of the multilayer resin substrate 103. FIG. 13 is a C-C cross-sectional view in FIG. 11. In FIG. 12, in order to make the structure easy to understand, wide portions WP1 and WP2 of second coil conductor patterns CP21B and CP22B are indicated by hatching.

The multilayer resin substrate 103 is different from the multilayer resin substrate 102 according to the second preferred embodiment in that a coil L3 is provided. The coil L3 includes a plurality of coil conductor patterns (one or more first coil conductor patterns CP11B and CP12B, and two or more second coil conductor patterns CP21B and CP22B). Other configurations of the multilayer resin substrate 103 are the same or substantially the same as the configurations of the multilayer resin substrate 102.

Hereinafter, differences from the multilayer resin substrate 102 according to the second preferred embodiment will be described.

As shown in FIG. 12, a second coil conductor pattern CP21B is provided on a back surface of the resin layer 11a. The second coil conductor pattern CP21B is a rectangular or substantially rectangular spiral-shaped conductor pattern of about 2.75 turns, and is disposed near the center in the longitudinal direction of the resin layer 11a. The second coil conductor pattern CP21B includes a wide portion WP1 in an outermost peripheral portion (about one turn portion located on an outermost peripheral side) in a radial direction.

A first coil conductor pattern CP11B and a conductor pattern 23 are provided on a back surface of the resin layer 12a. The first coil conductor pattern CP11B is a rectangular or substantially rectangular spiral-shaped conductor pattern of about three turns, and is disposed near the center in the longitudinal direction of the resin layer 12a. The conductor pattern 23 is the same or substantially the same as the conductor pattern described in the second preferred embodiment.

A first coil conductor pattern CP12B and a conductor pattern 22 are provided on a back surface of the resin layer 13a. The first coil conductor pattern CP12B is a rectangular or substantially rectangular spiral-shaped conductor pattern of about three turns, and is disposed near the center in the longitudinal direction of the resin layer 13a. The conductor pattern 22 is the same or substantially the same as the conductor pattern described in the second preferred embodiment.

A second coil conductor pattern CP22B and a conductor pattern 21 are provided on a back surface of the resin layer 14a. The second coil conductor pattern CP22B is a rectangular or substantially rectangular spiral-shaped conductor pattern of about three turns, and is disposed near the center in the longitudinal direction of the resin layer 14a. The second coil conductor pattern CP22B includes a wide portion WP2 in an innermost peripheral portion (about one turn portion located on an innermost peripheral side) in a radial direction. The conductor pattern 21 is the same or substantially the same as the conductor pattern described in the second preferred embodiment.

External electrodes P1A and P2A are provided on a back surface of the resin layer 15a, and opening portions HP1 and HP2 are provided in the resin layer 16a. The external electrodes P1A and P2A, and the opening portions HP1 and HP2 are the same or substantially the same as the external electrodes and the opening portions described in the second preferred embodiment.

As shown in FIG. 12, one end of the second coil conductor pattern CP21B is connected to one end of the first coil conductor pattern CP11B through the interlayer connection conductor V5, and the other end of the first coil conductor pattern CP11B is connected to one end of the first coil conductor pattern CP12B through the interlayer connection conductor V6. The other end of the first coil conductor pattern CP12B is connected to one end of the second coil conductor pattern CP22B through the interlayer connection conductor V7. As described above, a plurality of coil conductor patterns (the first coil conductor patterns CP11B and CP12B, and the second coil conductor patterns CP21B and CP22B) provided, respectively, on the three or more resin layers 11a to 14a and the interlayer connection conductors V5, V6, and V7 define the coil L3 having a winding axis AX in the Z-axis direction.

In addition, a first end of the coil L3 is connected to the external electrode P1A, and a second end of the coil L3 is connected to the external electrode P2A. Specifically, the other end of the second coil conductor pattern CP21B is connected to the external electrode P1A through the conductor patterns 21, 22, and 23 and the interlayer connection conductors V1, V2, V3, and V4. In addition, the other end of the second coil conductor pattern CP22B is connected to the external electrode P2A through the interlayer connection conductor V8.

The wide portion WP1 (the outermost peripheral portion) of the second coil conductor pattern CP21B, when viewed in the Z-axis direction, includes an overlapping portion OP1 that overlaps with an adjacent first coil conductor pattern CP11B in the Z-axis direction, and a non-overlapping portion NOP1 that does not overlap with the adjacent first coil conductor pattern CP11B. The non-overlapping portion NOP1 of the second coil conductor pattern CP21B (the first main surface-side coil conductor pattern) is curved so as to be close to the other coil conductor patterns (the first coil conductor patterns CP11B and CP12B) located on the inner layer side.

The wide portion WP2 (the innermost peripheral portion) of the second coil conductor pattern CP22B, when viewed in the Z-axis direction, includes an overlapping portion OP2 that overlaps with an adjacent first coil conductor pattern CP12B in the Z-axis direction, and a non-overlapping portion NOP2 that does not overlap with the adjacent first coil conductor pattern CP12B. The non-overlapping portion NOP2 of the second coil conductor pattern CP22B (the second main surface-side coil conductor pattern) is curved so as to be close to the other coil conductor patterns (the first coil conductor patterns CP11B and CP12B) located on the inner layer side.

The non-overlapping portions NOP1 and NOP2 of the two adjacent second coil conductor patterns CP21B and CP22B in the Z-axis direction protrude in opposite directions in a radial direction, with respect to the first coil conductor patterns CP11B and CP12B.

As shown in the present preferred embodiment, each of the plurality of coil conductor patterns may have a spiral shape with two or more turns, for example. The plurality of coil conductor patterns are not limited to a configuration in which the plurality of coil conductor patterns each have the same or substantially the same number of turns. In other words, the plurality of coil conductor patterns each may have a different number of turns.

In a case in which both of the first main surface-side coil conductor pattern and the second main surface-side coil conductor pattern are the second coil conductor patterns including a wide portion, one of the non-overlapping portions is located at least in the outermost peripheral portion in the radial direction, the other of the non-overlapping portions is located at least in the innermost peripheral portion, and all of the non-overlapping portions are preferably curved so as to close to the other coil conductor patterns located on the inner layer side. As described in the second preferred embodiment, according to such a configuration, the other coil conductor patterns located on the inner layer side are structured so as to be enclosed by the second coil conductor patterns (the first main surface-side coil conductor pattern and the second main surface-side coil conductor pattern), so that the displacement of all of the plurality of coil conductor patterns at the time of thermocompression bonding is able to be further reduced or prevented.

While the present preferred embodiment shows an example in which the wide portions WP1 and WP2 are located only in the outermost peripheral portion or only in the innermost peripheral portion in the radial direction of the spiral-shaped second coil conductor patterns CP21B and CP22B, the multilayer resin substrate is not limited to such a configuration. The wide portions WP1 and WP2 may be provided in portions other than the outermost peripheral portion or the innermost peripheral portion of the spiral-shaped second coil conductor pattern, or the entirety or substantially the entirety of the spiral-shaped second coil conductor pattern may be a wide portion.

Fourth Preferred Embodiment

A fourth preferred embodiment of the present invention shows an example of a multilayer resin substrate including three or more second coil conductor patterns.

Figure 14:
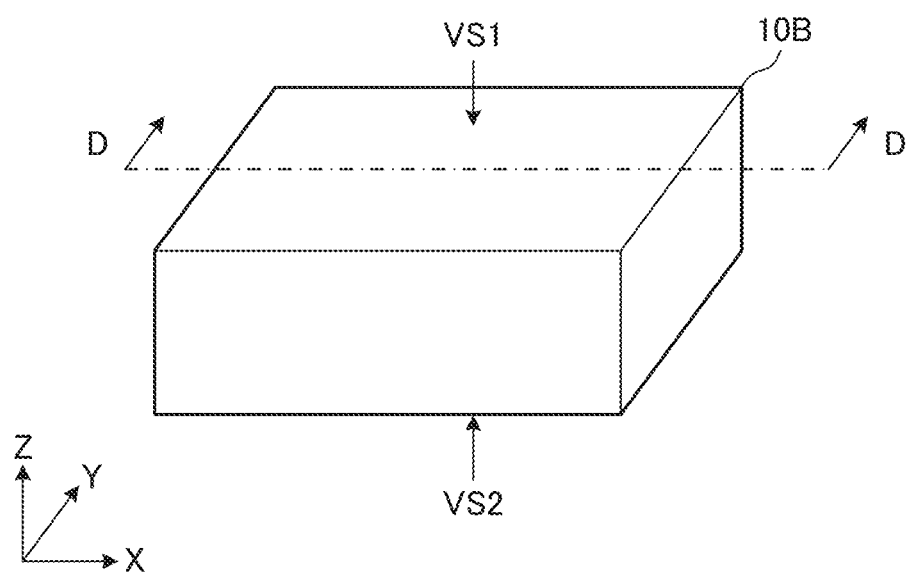
FIG. 14 is an external perspective view of a multilayer resin substrate 104 according to a fourth preferred embodiment of the present invention.
Figure 15:
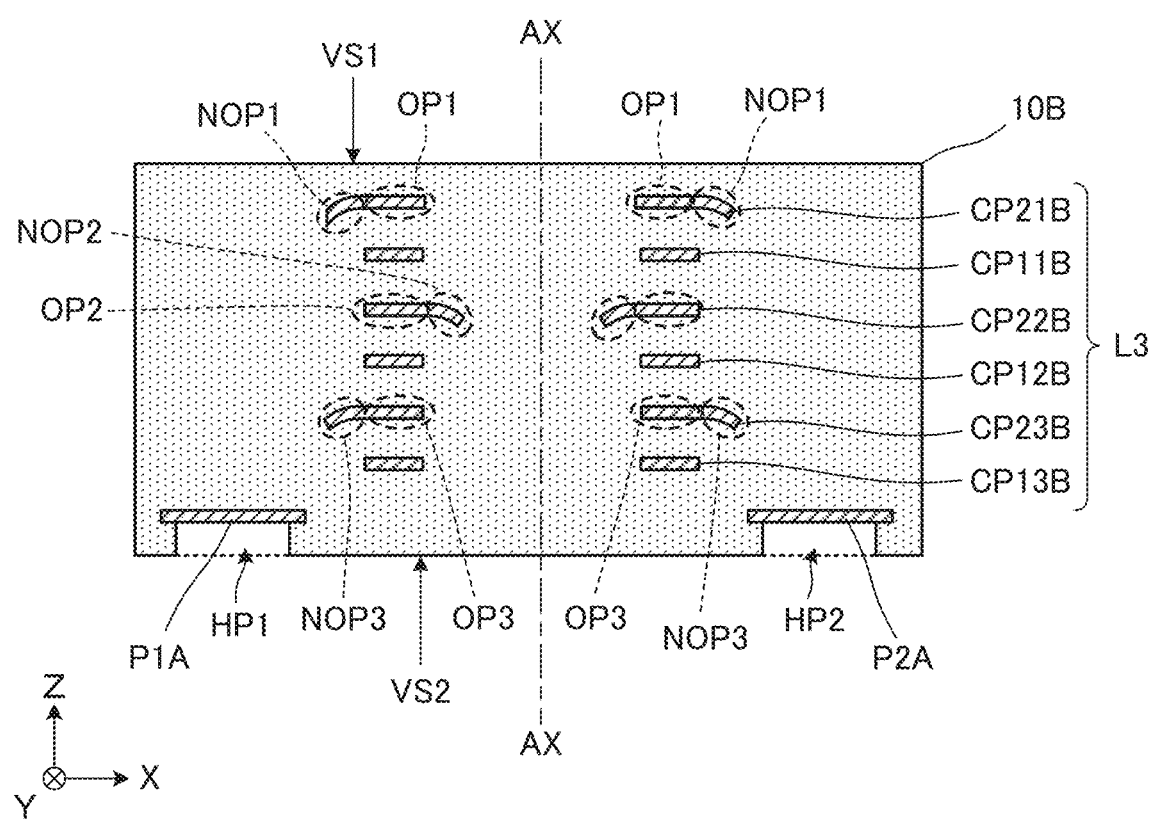
FIG. 15 is a D-D cross-sectional view in FIG. 14.

FIG. 14 is an external perspective view of a multilayer resin substrate 104 according to the fourth preferred embodiment of the present invention. FIG. 15 is a D-D cross-sectional view in FIG. 14.

The multilayer resin substrate 104 includes a stacked body 10B, a coil L3, and external electrodes P1A and P2A. The external electrodes P1A and P2A are the same or substantially the same as the external electrodes described in the second preferred embodiment. The stacked body 10B includes a larger number of layers of the resin layers than the stacked body 10A described in the second preferred embodiment. Other configurations of the stacked body 10B are the same or substantially the same as the configurations of the stacked body 10A.

Hereinafter, differences from the multilayer resin substrate 102 according to the second preferred embodiment will be described.

The coil L3 includes a plurality of coil conductor patterns (three first coil conductor patterns CP11B, CP12B, and CP13B, and three second coil conductor patterns CP21B, CP22B, and CP23B) provided on three or more resin layers, respectively. Although not shown, a first end of the coil L3 is connected to the external electrode P1A, and a second end of the coil L3 is connected to the external electrode P2A.

Each of the first coil conductor patterns CP11B, CP12B, and CP13B, and the second coil conductor patterns CP21B, CP22B, and CP23B is a rectangular or substantially rectangular loop-shaped conductor pattern of about one turn. As shown in FIG. 15, in the present preferred embodiment, the first coil conductor patterns CP11B, CP12B, and CP13B, and the second coil conductor patterns CP21B, CP22B, and CP23B are alternately disposed in the Z-axis direction. Specifically, the second coil conductor pattern CP21B, the first coil conductor pattern CP11B, the second coil conductor pattern CP22B, and the first coil conductor pattern CP12B, the second coil conductor pattern CP23B, and the first coil conductor pattern CP13B are sequentially disposed in the negative Z direction.

The non-overlapping portion NOP1 of the second coil conductor pattern CP21B is curved so as to be closer to the first coil conductor pattern CP11B than the overlapping portion OP1. The non-overlapping portion NOP2 of the second coil conductor pattern CP22B is curved so as to be closer to the first coil conductor pattern CP12B than the overlapping portion OP2. The non-overlapping portion NOP3 of the second coil conductor pattern CP23B is curved so as to be closer to the first coil conductor pattern CP13B than the overlapping portion OP3.

In addition, the non-overlapping portions NOP1 and NOP2 of the two adjacent second coil conductor patterns CP21B and CP22B in the Z-axis direction protrude in opposite directions in a radial direction, with respect to the first coil conductor patterns CP11B and CP12B. The non-overlapping portions NOP2 and NOP3 of the two adjacent second coil conductor patterns CP22B and CP23B in the Z-axis direction protrude in opposite directions in a radial direction, with respect to the first coil conductor patterns CP12B and CP13B. More specifically, the non-overlapping portions NOP1 and NOP3 protrude more to the outer peripheral side than the first coil conductor patterns CP11B, CP12B, and CP13B, and the non-overlapping portion NOP2 protrudes more to the inner peripheral side than the first coil conductor patterns CP11B and CP12B.

As described in the present preferred embodiment, the number of first coil conductor patterns may be three or more, and the number of second coil conductor patterns may be three or more. In addition, for example, the number of first coil conductor patterns may be one.

The multilayer resin substrate 104 according to the present preferred embodiment includes a second coil conductor pattern CP22B located on the inner layer side, in addition to the first main surface-side coil conductor pattern (the second coil conductor pattern CP21B located closest to the first main surface VS1 in the Z-axis direction, among the second coil conductor patterns) and the second main surface-side coil conductor pattern (the second coil conductor pattern CP23B located closest to the second main surface VS2 in the Z-axis direction, among the second coil conductor patterns). According to such a configuration, the flow of resin at the time of thermocompression bonding is significantly reduced or prevented not only by the non-overlapping portions NOP1 and NOP3 provided for the first main-surface side coil conductor pattern and the second main surface-side coil conductor pattern but by the non-overlapping portion NOP2 provided for the second coil conductor pattern CP22B on the inner layer side. Therefore, the displacement of the entire coil is significantly reduced or prevented in comparison with a case in which the non-overlapping portion is only provided for the first main surface-side coil conductor pattern and the second main surface-side coil conductor pattern.

Fifth Preferred Embodiment

A fifth preferred embodiment of the present invention shows an example of a multilayer resin substrate in which a second coil conductor pattern includes a first portion and a second portion that are located in opposite directions (on opposite sides) with respect to a winding axis, and the first portion and the second portion include non-overlapping portions that protrude in the same direction.

Figure 16:
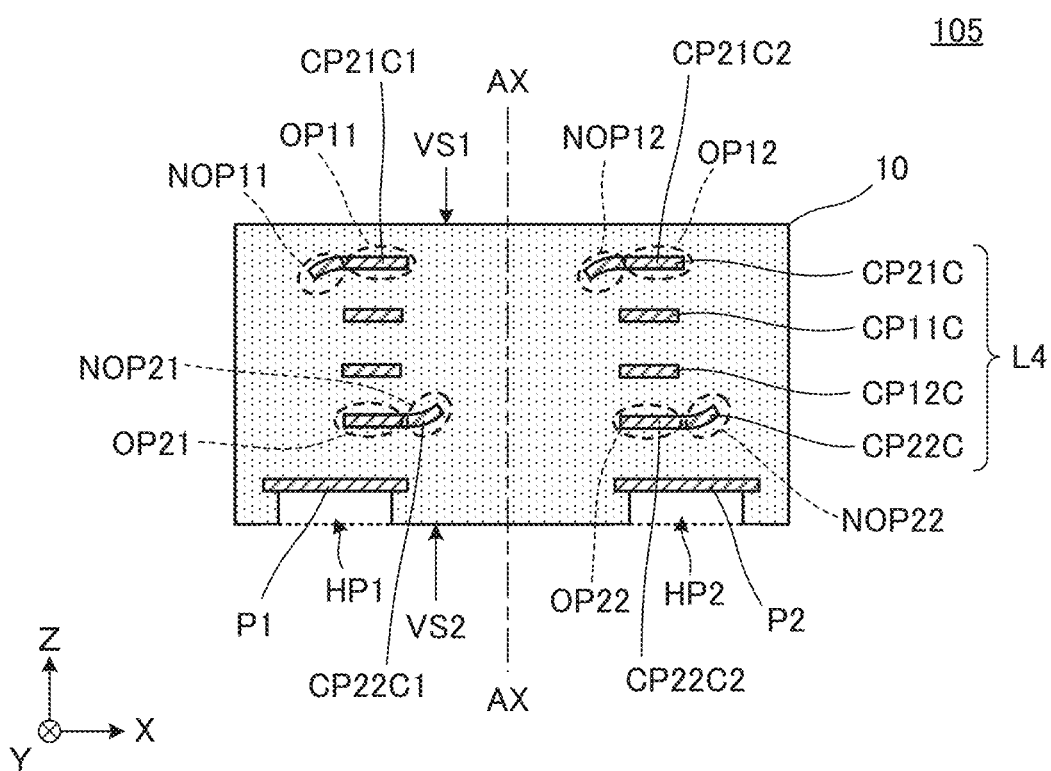
FIG. 16 is a cross-sectional view of a multilayer resin substrate 105 according to a fifth preferred embodiment of the present invention.

FIG. 16 is a cross-sectional view of a multilayer resin substrate 105 according to the fifth preferred embodiment of the present invention. The multilayer resin substrate 105 has the same or substantially the same appearance as the multilayer resin substrate 101 (see FIG. 1) according to the first preferred embodiment. FIG. 16 shows an A-A cross-sectional view (see FIG. 1) of the multilayer resin substrate 105.

The multilayer resin substrate 105 is different from the multilayer resin substrate 101 in that a coil L4 is provided. Other configurations of the multilayer resin substrate 105 are the same or substantially the same as the configurations of the multilayer resin substrate 101.

Hereinafter, differences from the multilayer resin substrate 101 according to the first preferred embodiment will be described.

The coil L4 includes a plurality of coil conductor patterns (first coil conductor patterns CP11C and CP12C, and second coil conductor patterns CP21C and CP22C). A first end of the coil L4 is connected to the external electrode P1, and a second end of the coil L4 is connected to the external electrode P2.

Each of the first coil conductor patterns CP11C and CP12C and the second coil conductor patterns CP21C and CP22C is a rectangular or substantially rectangular loop-shaped conductor pattern of about one turn. The second coil conductor pattern CP21C, the first coil conductor pattern CP11C, the first coil conductor pattern CP12C, and the second coil conductor pattern CP22C are disposed in this order in the negative Z direction.

The second coil conductor pattern CP21C includes a first portion CP21C1 and a second portion CP21C2. The first portion CP21C1 and the second portion CP21C2, when viewed in the Z-axis direction, are located in opposite directions to each other with respect to a winding axis AX. The first portion CP21C1 includes an overlapping portion OP11 and a non-overlapping portion NOP11. The second portion CP22C2 includes an overlapping portion OP12 and a non-overlapping portion NOP12. The non-overlapping portion NOP11 and the non-overlapping portion NOP12, when viewed in the Z-axis direction, protrude in the same direction as each other with respect to the first coil conductor patterns CP11C and CP12C.

Similarly, the second coil conductor pattern CP22C includes a first portion CP22C1 and a second portion CP22C2. The first portion CP22C1 and the second portion CP22C2, when viewed in the Z-axis direction, are located in opposite directions to each other with respect to the winding axis AX. The first portion CP22C1 includes an overlapping portion OP21 and a non-overlapping portion NOP21. The second portion CP22C2 includes an overlapping portion OP22 and a non-overlapping portion NOP22. The non-overlapping portion NOP21 and the non-overlapping portion NOP22, when viewed in the Z-axis direction, protrude in the same direction as each other with respect to the first coil conductor patterns CP11C and CP12C.

The first portion and the second portion of the second coil conductor pattern may face each other, and the non-overlapping portions of the first portion and the second portion may protrude in the same direction in a direction in which the first portion and the second portion face each other, with respect to the first coil conductor pattern.

The first portion CP21C1 of the second coil conductor pattern CP21C and the first portion CP22C1 of the second coil conductor pattern CP22C, when viewed in the Z-axis direction, are located in the same direction as each other to the winding axis AX. The non-overlapping portion NOP11 and the non-overlapping portion NOP21, when viewed in the Z-axis direction, protrude in the opposite directions to each other with respect to the first coil conductor patterns CP11C and CP12C.

Similarly, the second portion CP21C2 of the second coil conductor pattern CP21C and the second portion CP22C2 of the second coil conductor pattern CP22C, when viewed in the Z-axis direction, are located in the same direction as each other with respect to the winding axis AX. The non-overlapping portion NOP12 and the non-overlapping portion NOP22, when viewed in the Z-axis direction, protrude in the opposite directions to each other with respect to the first coil conductor patterns CP11C and CP12C.

The non-overlapping portion NOP11 is curved so as to be closer in the Z-axis direction to the first coil conductor patterns CP11C and CP12C than the overlapping portion OP11. The non-overlapping portion NOP21 is curved so as to be closer in the Z-axis direction to the first coil conductor patterns CP11C and CP12C than the overlapping portion OP21. In other words, the non-overlapping portion NOP11 and the non-overlapping portion NOP21 protrude in the opposite directions to each other in the Z-axis direction.

Similarly, the non-overlapping portion NOP12 is curved so as to be closer in the Z-axis direction to the first coil conductor patterns CP11C and CP12C than the overlapping portion OP12. The non-overlapping portion NOP22 is curved so as to be closer in the Z-axis direction to the first coil conductor patterns CP11C and CP12C than the overlapping portion OP22. In other words, the non-overlapping portion NOP12 and the non-overlapping portion NOP22 protrude in the opposite directions to each other in the Z-axis direction.

According to the first preferred embodiment, the second coil conductor pattern CP22 includes the first portion and the second portion that are located in the opposite directions with respect to the winding axis AX, and the non-overlapping portions NOP2 of the first portion and the second portion face each other (see FIG. 3). In contrast, according to the fifth preferred embodiment, the non-overlapping portion NOP21 and the non-overlapping portion NOP22, when viewed in the Z-axis direction, protrude in the same direction as each other with respect to the first coil conductor patterns CP11C and CP12C. Therefore, the non-overlapping portion NOP21 and the non-overlapping portion NOP22 do not face each other. Therefore, according to the fifth preferred embodiment, in comparison with the first preferred embodiment, the unwanted capacitance that may be generated between the non-overlapping portions is able to be significantly reduced or prevented.

In addition, according to the fifth preferred embodiment, the non-overlapping portion NOP11 and the non-overlapping portion NOP21, when viewed in the Z-axis direction, protrude in the opposite directions to each other, and protrude in the opposite directions to each other also in the Z-axis direction. The same applies to the non-overlapping portion NOP12 and the non-overlapping portion NOP22. Therefore, the first coil conductor patterns CP11C and CP12C are interposed between and surrounded by the second coil conductor patterns CP21C and CP22C. As a result, displacement or deformation of the first coil conductor patterns CP11C and CP12C with the flow of resin at the time of thermocompression bonding is further reduced or prevented.

Sixth Preferred Embodiment

The multilayer resin substrate according to the first to the fifth preferred embodiments includes at least one first coil conductor pattern between the second coil conductor patterns. A sixth preferred embodiment of the present invention shows an example of a multilayer resin substrate including no first coil conductor pattern provided between second coil conductor patterns.

Figure 17:
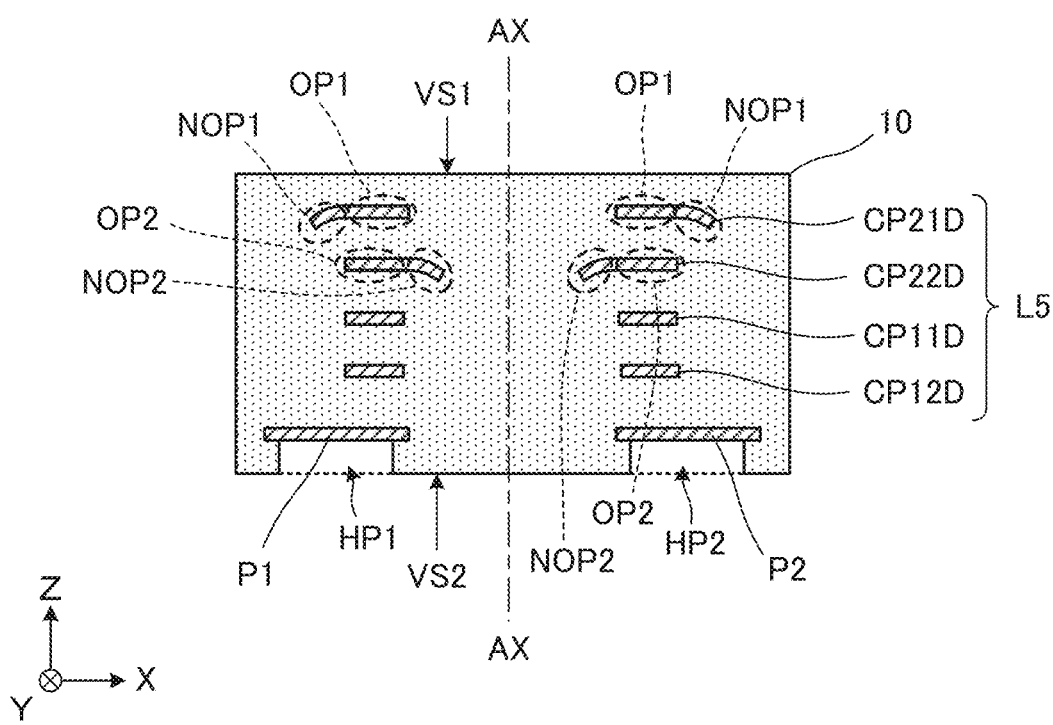
FIG. 17 is a cross-sectional view of a multilayer resin substrate 106 according to a sixth preferred embodiment of the present invention.

FIG. 17 is a cross-sectional view of a multilayer resin substrate 106 according to the sixth preferred embodiment of the present invention. The multilayer resin substrate 106 has the same or substantially the same appearance as the multilayer resin substrate 101 (see FIG. 1) according to the first preferred embodiment. FIG. 17 shows an A-A cross-sectional view (see FIG. 1) of the multilayer resin substrate 106.

The multilayer resin substrate 106 is different from the multilayer resin substrate 101 in that a coil L5 is provided. Other configurations of the multilayer resin substrate 106 are the same or substantially the same as the configurations of the multilayer resin substrate 101.

Hereinafter, differences from the multilayer resin substrate 101 according to the first preferred embodiment will be described.

The coil L5 includes a plurality of coil conductor patterns (first coil conductor patterns CP11D and CP12D, and second coil conductor patterns CP21D and CP22D). The second coil conductor pattern CP21D, the second coil conductor pattern CP22D, the first coil conductor pattern CP11D, and the first coil conductor pattern CP12D are disposed in this order in the negative Z direction. The first coil conductor pattern is not provided between the adjacent second coil conductor patterns CP21D and CP22D.

The non-overlapping portion NOP1 of the second coil conductor pattern CP21D is curved so as to be closer in the Z-axis direction to the first coil conductor patterns CP11D and CP12D than the overlapping portion OP1 of the second coil conductor pattern CP21D. Similarly, the non-overlapping portion NOP2 of the second coil conductor pattern CP22D is curved so as to be closer in the Z-axis direction to the first coil conductor patterns CP11D and CP12D than the overlapping portion OP2 of the second coil conductor pattern CP22D. The non-overlapping portion NOP1 of the second coil conductor pattern CP21D, and the non-overlapping portion NOP2 of the second coil conductor pattern CP22D, when viewed in the Z-axis direction, protrude in opposite directions to each other in a radial direction, with respect to first coil conductor patterns CP11D and CP12D.

In the sixth preferred embodiment, unwanted capacitance that may be generated between the non-overlapping portions is able to be significantly reduced or prevented. However, in order to significantly reduce or prevent displacement or deformation of the first coil pattern in a wider area, the second coil conductor patterns are preferably disposed dispersedly, as with the first preferred embodiment.

Other Preferred Embodiments

While each of the above described preferred embodiments provides an example in which the stacked body has a rectangular or substantially rectangular parallelepiped shape with the longitudinal direction extending in the X-axis direction, the shape of the stacked body is not limited to such a configuration. The shape of the stacked body is able to be appropriately changed within the scope of producing the functions and advantageous effects of the present invention. The planar shape of the stacked body may be a polygonal or substantially polygonal shape, a circular or substantially circular shape, an elliptical or substantially elliptical shape, an L shape, a U shape, a crank shape, a T shape, a Y-shape, or a suitable shape, for example.

In addition, while each of the above described preferred embodiments provides an example of the stacked body provided by thermally compressing six resin layers, the stacked bodies according to preferred embodiments of the present invention are not limited to such a configuration. The number of layers of the resin layers that define the stacked body is able to be appropriately changed. In addition, a protective film such as a coverlay film and a resist film, for example, may be provided on a surface of the stacked body.

While each of the above preferred embodiments of the present invention shows an example of the coil L1, the coil L2, and the coil L3 of which the winding axis AX coincides with the Z-axis direction, the winding axis AX of the coil and the Z-axis direction are not required to strictly coincide with each other. In various preferred embodiments of the present invention, "including the winding axis in the stacking direction of the plurality of resin layers" includes an example in which the winding axis AX of the coil extending in a range from about minus 30 degrees to about plus 30 degrees with respect to the Z-axis direction, for example. In addition, while each of the above preferred embodiments of the present invention shows an example in which the coil is provided inside the stacked body, the coil may be partially exposed to the surface of the stacked body.

In addition, a circuit configuration provided on the multilayer resin substrate is not limited to the configuration described in each of the above preferred embodiments, and is able to be appropriately changed within the scope of producing the functions and advantageous effects of the preferred embodiments of the present invention. In a circuit provided on the multilayer resin substrate, a capacitor defined by the conductor pattern or a frequency filter such as various filters (a low-pass filter, a high-pass filter, a band-pass filter, a band-elimination filter), for example, may be provided. Moreover, various transmission lines (a strip line, a microstrip line, a coplanar line, and the like, for example) may be provided on the multilayer resin substrate. Furthermore, various electronic components such as chip components, for example, may be mounted on or embedded in the multilayer resin substrate.

The planar shape, position, and number of first coil conductor patterns, second coil conductor patterns, and external electrodes are not limited to the configuration described in each of the above preferred embodiments and are able to be appropriately changed within the scope of producing the functions and advantageous effects of the preferred embodiments of the present invention. The external shape of the first coil conductor pattern and the second coil conductor pattern is not be limited to a rectangular or substantially rectangular, and may be a polygonal or substantially polygonal shape, a circular or substantially circular shape, an elliptical or substantially elliptical shape, or a suitable shape, for example. In addition, the planar shape of the external electrode may be a polygonal or substantially polygonal shape, a circular or substantially circular shape, an elliptical or substantially elliptical shape, an arc shape, a ring shape, an L shape, a U shape, a T shape, a Y shape, a crank shape, or a suitable shape, for example. Furthermore, the external electrode may be provided on the second main surface VS2 or may be provided both near the first main surface VS1 (or on the first main surface VS1) and near the second main surface VS2 (or on the second main surface VS2). Furthermore, the multilayer resin substrate may include a dummy electrode that is not connected to a circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer resin substrate comprising:
a stacked body including a plurality of resin layers stacked on each other; and
a coil including a plurality of coil conductor patterns, respectively, on three or more resin layers among the plurality of resin layers, and including a winding axis in a stacking direction of the plurality of resin layers, wherein
the plurality of coil conductor patterns includes:
a first coil conductor pattern; and
a plurality of second coil conductor patterns adjacent to the first coil conductor pattern in the stacking direction and including a wide portion with a line width larger than a line width of the first coil conductor pattern;
the wide portion includes:
an overlapping portion overlapping with an adjacent first coil conductor pattern, when viewed in the stacking direction; and
a non-overlapping portion not overlapping with the adjacent first coil conductor pattern, when viewed in the stacking direction;
the first coil conductor pattern is on one side or each side in the stacking direction of at least one second coil conductor pattern among the plurality of second coil conductor patterns, and the non-overlapping portion of the at least one second coil conductor pattern is curved so as to be closer in the stacking direction to the first coil conductor pattern disposed on one side in the stacking direction of the at least one second coil conductor pattern than the overlapping portion of the at least one second coil conductor pattern;

non-overlapping portions of two adjacent second coil conductor patterns that are most adjacent to one another in the stacking direction, among the plurality of second coil conductor patterns, when viewed in the stacking direction, protrude in opposite directions to each other in a radial direction of the second coil conductor patterns, with respect to the first coil conductor pattern; and overlapping portions of the two most adjacent second coil conductor patterns overlap with each other, when viewed in the stacking direction, and the non-overlapping portions of the two most adjacent second coil conductor patterns do not overlap with each other, when viewed in the stacking direction.

2. The multilayer resin substrate according to claim 1, wherein the stacked body includes a main surface perpendicular or substantially perpendicular to the stacking direction;

one of the plurality of second coil conductor patterns is an outermost layer-side coil conductor pattern located closest to the main surface in the stacking direction, among the plurality of coil conductor patterns; and the non-overlapping portion of the outermost layer-side coil conductor pattern is curved so as to be close to other coil conductor patterns located on an inner layer side.

3. The multilayer resin substrate according to claim 2, further comprising:

an external electrode provided on the stacked body; wherein the wide portion of a second coil conductor pattern located closest to the external electrode in the stacking direction, among the plurality of second coil conductor patterns, includes an electrode overlapping portion that overlaps with the external electrode, and an electrode non-overlapping portion that does not overlap with the external electrode, when viewed in the stacking direction; and the electrode non-overlapping portion is curved so as to be closer to the external electrode than the electrode overlapping portion.

4. The multilayer resin substrate according to claim 2, wherein the main surface includes a first main surface and a second main surface that face each other;

the plurality of second coil conductor patterns include:

a first main surface-side coil conductor pattern located closest to the first main surface in the stacking direction, among the plurality of coil conductor patterns; and a second main surface-side coil conductor pattern located closest to the second main surface in the stacking direction, among the plurality of coil conductor patterns; and a non-overlapping portion of the first main surface-side coil conductor pattern and a non-overlapping portion of the second main surface-side coil conductor pattern are curved so as to be close to the other coil conductor patterns located on the inner layer side, respectively.

5. The multilayer resin substrate according to claim 1, wherein the plurality of coil conductor patterns each have a spiral shape with two or more turns.

6. The multilayer resin substrate according to claim 1, wherein the first coil conductor pattern and the plurality of second coil conductor patterns are alternately disposed in the stacking direction.

7. The multilayer resin substrate according to claim 1, wherein each of the plurality of resin layers includes a liquid crystal polymer or a polyether ether ketone as a main component.

8. The multilayer resin substrate according to claim 1, wherein each of the plurality of coil conductor patterns includes a Cu foil.

9. The multilayer resin substrate according to claim 1, wherein the first coil conductor pattern is a rectangular or substantially rectangular loop-shaped conductor pattern including about one turn.

10. The multilayer resin substrate according to claim 1, wherein an entirety or substantially an entirety of at least one of the plurality of second coil conductor patterns defines the wide portion.

11. The multilayer resin substrate according to claim 1, wherein at least one of the plurality of second coil conductor patters has a rectangular or substantially rectangular spiral shape including about 2.75 turns.

12. The multilayer resin substrate according to claim 1, wherein the first coil conductor pattern is a rectangular or substantially rectangular spiral-shaped conductor pattern including about three turns.

* * * * *